US 6,585,914 B2

(12) United States Patent
Marks et al.

(10) Patent No.: US 6,585,914 B2
(45) Date of Patent: Jul. 1, 2003

(54) N-TYPE THIOPHENE SEMICONDUCTORS

(75) Inventors: Tobin J. Marks, Evanston, IL (US); Antonio Facchetti, Chicago, IL (US)

(73) Assignee: Northwestern University, Evanston, IL (US)

(*) Notice: Subject to any disclaimer, the term of this patent is extended or adjusted under 35 U.S.C. 154(b) by 0 days.

(21) Appl. No.: 09/915,206

(22) Filed: Jul. 24, 2001

(65) Prior Publication Data

US 2003/0080324 A1 May 1, 2003

Related U.S. Application Data

(60) Provisional application No. 60/220,601, filed on Jul. 24, 2000.

(51) Int. Cl.$^7$ ............................................. H01B 1/12
(52) U.S. Cl. ........................................ 252/500; 528/377
(58) Field of Search ........................... 252/500; 528/377

(56) References Cited

U.S. PATENT DOCUMENTS

| 4,321,114 A | * | 3/1982 | MacDiarmid et al. ....... 204/2.1 |
| 5,247,062 A | * | 9/1993 | Sawada et al. ............. 528/377 |
| 5,546,889 A | | 8/1996 | Wakita et al. |
| 5,792,557 A | | 8/1998 | Nakaya et al. |
| 5,945,502 A | | 8/1999 | Hsieh et al. |
| 6,074,734 A | | 6/2000 | Kawamura et al. |
| 6,136,702 A | | 10/2000 | Chandross et al. |

FOREIGN PATENT DOCUMENTS

| JP | 2-272066 | * | 6/1990 |
| JP | 4-222623 | * | 8/1992 |
| WO | WO 99/54936 | | 10/1999 |

* cited by examiner

Primary Examiner—Mark Kopec
(74) Attorney, Agent, or Firm—Reinhart Boerner Van Deuren

(57) ABSTRACT

The new fluorocarbon-functionalized and/or heterocycle-modified polythiophenes, in particular, $\alpha,\omega$-diperfluorohexylsexithiophene DFH-6T can be straightforwardly prepared in high yield and purity. Introduction of such modifications to a thiophene core affords enhanced thermal stability and volatility, and increased electron affinity versus the unmodified compositions of the prior art. Evaporated films behave as n-type semiconductors, and can be used to fabricate thin film transistors with FET mobilities ~0.01 cm$^2$/Vs—some of the highest reported to date for n-type organic semiconductors.

10 Claims, 17 Drawing Sheets

A)

B)

A)

B)

C)

A)

B)

BFT4BF

TBFT2BFT iso-DFH6T

TPMT2PMT

BFT4BF (2a)

a = 6.3854(15) Å    α = 89.412(4)°
b = 7.6862(18) Å    β = 78.660(4)°
c = 12.502(3) Å     γ = 80.760(4)°
V = 593.7(2) Å³

N-TYPE THIOPHENE SEMICONDUCTORS

This application claims the benefit of prior provisional patent application No. 60/220,601, filed Jul. 24, 2000, the entirety of which is incorporated herein by reference.

The United States Government has rights in this invention pursuant to Grant No. N00421-98-1187 from DARPA and the NSF-MRSEC program (DMR-9632472) to Northwestern University.

BACKGROUND OF THE INVENTION

Thiophene chemistry and the chemical stability of the thiophene ring hold potential for use of thiophene materials in molecular-based electronics and photonics. In particular, αα'-conjugated thiophene oligomers (nTs) and polymers (polythiophenes-PTs) have attracted great interest as semiconducting elements in organic thin-film transistors (TFTs).[1,2,] To be useful in such devices and related structures, the

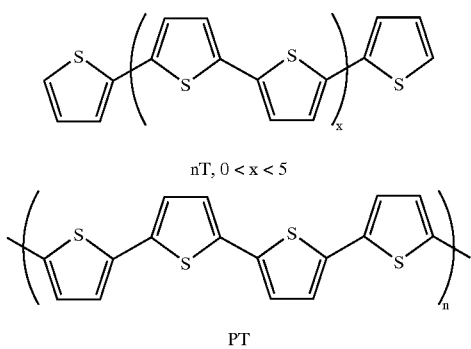

organic material must support a channel of holes or electrons (p- or n-type semiconductor, respectively) created by the gate electrode bias, which switches the device "on". Furthermore, the charge mobility of the material must be sufficiently large to increase the source-drain on-conduction by many orders of magnitude over the "off" state. The density of the charge carrier in the channel is modulated by voltage applied at the gate electrode.

To date, the most noteworthy examples of this family of compounds are unsubstituted, α,ω- and β,β'-dialkylsubstituted nT (n=4,6), and β-alkylsubstituted PT, where optimized carrier mobilities (0.1–0.6 cm$^2$ V$^{-1}$ s$^{-1}$) and on/off ratios (>10$^6$) approach those of amorphous silicon.[1e,2a,c,e,3] However, without exception, these systems facilitate hole injection and behave as p-type semiconductors, presumably because the thiophene electron-richness renders negative carriers susceptible to trapping by residual impurities such as oxygen[4]. Even so, increasing the number of thiophene units decreases dramatically environmental (air, light) stability and causes processing and purification difficulties.

Electron transporting (n-type) organic materials are relatively rare. However, developing/understanding new n-type materials would enable applications[5] such as bipolar transistors, p-n junction diodes, and complementary circuits as well as afford better fundamental understanding of charge transport in molecular solids. The major barrier to progress however, is that most n-type organics are either environmentally sensitive, have relatively low field mobilities, lack volatility for efficient film growth, and/or are difficult to synthesize.[5e,6,7]

As indicated by the foregoing notations, these and other aspects of and teachings of the prior art can be found in the following:

[1] (a) G. Horowitz, F. Kouki, A. El Kassmi, P. Valat, V. Wintgens, F. Gamier, *Adv. Mater.* 1999, 11, 234. (b) F. Gamier, R. Hajaoui, A. El Kassmi, G. Horowitz, L. Laigre, W. Porzio, M. Armanini, F. Provasoli, *Chem. Mater.* 1998, 10, 3334. (c) X. C. Li, H. Sirringhaus, F. Gamier, A. B. Holmes, S. C. Moratti, N. Feeder, W. Clegg, S. J. Teat, R. H. Friend, *J. Am. Chem. Soc.* 1998, 120, 2206. (d) G. Horowitz, F. Kouki, F. Gamier, *Adv. Mater.* 1998, 10, 382. (e) L. Antolini, G. Horowitz, F. Kouki, F. Garnier, *Adv. Mater.* 1998. 10, 381. (f) G. Horowitz, *Adv. Mater.* 1998, 10, 365.

[2] (a) W. Li, H. E. Katz, A. J. Lovinger, J. G. Laquindanum, *Chem. Mater.* 1999, 11, 458. (b) H. E. Katz, J. G. Laquindanum, A. J. Lovinger, *Chem. Mater.* 1998, 10, 633. (c) J. G. Laquindanum, H. E. Katz, A. J. Lovinger, *J. Am. Chem. Soc.* 1998, 120, 664. (d) T. Siegrist, C. Kloc, R. A. Laudise, H. E. Katz, R. C. Haddon, *Adv. Mater.* 1998, 10, 379. (e) H. E. Katz, *J. Mater. Chem.* 1997, 7, 369. (f) A. Dodalabapur, L. Torsi, H. E. Katz, *Science* 1995, 268, 270.

[3] (a) H. Sirringhaus, P. J. Brown, R. H. Friend, K. Bechgaard, B. M. W. Lengeveld-Voss, A. J. H. Spiering, R. A. J. Janssen, E. W. Meijer, P. Herving, D. M. de Leeuw, *Nature* 1999, 401, 685. (b) G. Barbarella, M. Zambianchi, L. Antolini, P. Ostoja, P. Maccagnani, A. Bongini, E. A. Marseglia, E. Tedesco, G. Gigli, R. Cingolani, *J. Am. Chem. Soc.* 1999, 121, 8920. (c) J. H. Shon, C. Kloc, R. A. Laudise, B. Batlogg, *Appl. Phys. Lett.* 1998, 73, 3574.

[4] *Handbook of Heterocyclic Chemistry*; A. R. Katritzky Ed.; Pergamon Press: Oxford, 1983.

[5] (a) Y. Y. Lin, A. Dodabalapur, R. Sarpeshkar, Z. Bao, W. Li, K. Baldwin, V. R. Raju, H. E. Katz, *Appl. Phys. Lett.* 1999, 74, 2714. (b) G. Horowitz, *Adv. Mater.* 1998, 10, 365. (c) A. Dodalabapur, J. G. Laquindanum, H. E. Katz, Z. Bao, *Appl. Phys. Lett* 1996, 69, 4227. (d) N. C. Greenham, S. C. Moratti, D. D. C. Bradley, R. H. Friend, *Nature* 1993, 365, 628. (e) S. Sze, *Semiconductor Devices Physics and Technology*; Wiley: N.Y., 1985; p. 481.

[6] (a) C. P. Jarret, K. Pichler, R. Newbould, R. H. Friend, *Synth. Met.* 1996, 77,35. (b) R. C. Haddon, *J. Am. Chem. Soc.* 1996, 118, 3041. (c) G. Horowitz, F. Kouki, P. Spearman, D. Fichou, C. Nogues, X: Pan, F. Gamier, *Adv. Mater.* 1996, 8, 242. (d) J. G. Laquindanum, H. E. Katz, A. Dodalabapur, A. J. Lovinger, *J. Am. Chem. Soc.* 1996,118, 11331.

[7] The transport properties of metal/α,ω-dicyano-6HT/metal structures are highly metal/interface-dependent; TFT carrier signs and mobilities have not been reported: F. Demanze, A. Yassar, D. Fichou, *Synthetic Metals* 1999, 101 620.

SUMMARY OF THE INVENTION

As shown from the above discussion, there are a considerable number of problems and deficiencies associated with the prior art relating to useful organic n-type semiconductor compounds, compositions and/or materials, including those discussed above. There is a demonstrated need for such materials, compositions, layers and/or composites for thin film deposition and related applications useful in conjunction with the fabrication of thin film transistors and related devices as can be incorporated into an integrated circuit.

Accordingly, it is an object of the present invention to provide new and useful n-type organic materials, together with one or more methods of preparation, overcoming those various shortcomings and deficiencies of the prior art.

It will be understood by those skilled in the art that one or more aspects of this invention can meet certain objectives, while one or more other aspects can meet certain other objectives. Each objective may not apply equally, in all instances, to every aspect of the present invention. As such, the following objects can be viewed in the alternative with respect to any one aspect of the present invention.

It is another object of the present invention to provide a facile, efficient synthetic method for the preparation of an n-type thiophene conductive material, such preparation resulting in high yield and purity of the desired thiophene material.

It is yet another object of the present invention to provide n-type semiconducting thiophene compounds and related materials and/or thin films which can be used in the fabrication of and in conjunction with a variety of circuitry related devices, including, but not limited to, diode, bipolar junction transistor and field-effect transistor (either junction or metal-oxide semiconductor) devices tion of substituents to a semiconducting composition to alter charge conduction there through, such that a material which would otherwise be considered a p-type conductor becomes an n-type conductor through a synthetic transformation of the type described herein. Various other properties such as band gap (expansion), electron mobility (increased), electron affinity (increased) and ionization potential (higher) are similarly altered.

The present invention includes the first n-type thiophene semiconductor compositions and/or materials, for use with a variety of applications or devices including, but not limited to, organic TFTs. A preferred thiophene composition/ material comprises δ,ω-diperfluorohexylsexithiophene

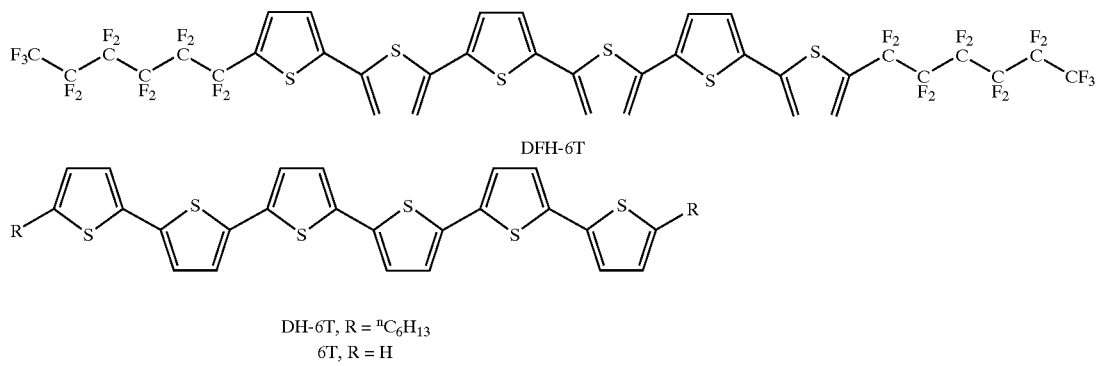

DFH-6T

DH-6T, R = $^nC_6H_{13}$
6T, R = H

It is yet another object of the present invention to provide for the synthetic. modification of organic semiconductive molecular solids to alter electronic behavior, in particular the use of such modified thiophenes to provide and facilitate electron transport.

Other objects, features, benefits and advantages of the present invention will be apparent from the foregoing, in light of the summary and the examples and descriptions which follow, and will be readily apparent to those skilled in the art having knowledge of various semiconducting materials, their preparation and subsequent use. Such objects, features, benefits and advantages will be apparent from the above as taken in conjunction with the accompanying examples, tables, graphs, data and all reasonable inferences to be drawn therefrom.

In accordance with one aspect of the present invention, one or more of the foregoing objects can be achieved by use of one or more of the thiophene compounds, compositions and/or materials of the type described herein, and/or with a suitable substrate material as part of a composite or a device incorporating such a composite.

In accordance with another aspect of the present invention, one or more of the preceding objects can be achieved with a method described herein, including the use of a thiophene material as an n-type semiconductor to transport electrons.

In accordance with another aspect of the present invention, one or more of the foregoing objects can be achieved with an organic thin film transistor device which includes a source electrode, a drain electrode and a semiconductor material between the electrodes, the material preferably comprising an n-type fluoroalkyl-substituted polythiophene composition.

In accordance with yet a further aspect of the present invention, a method is provided by way of using introducdesignated as DFH-6T, shown above and as structurally compared to the sexithiophene (6T) and dihexyl-sexithiophene (DH-6T) compositions of the prior art. Fluoroalkyl functionalization of a thiophene core significantly alters the electronic, film growth, and semiconducting properties of the resulting films.

The present invention contemplates, in part, a range of fluoroalkylated compositions and/or materials including the corresponding fluoroalkylated olio- and polythiophene compositions. Fluoroalkylation includes various alkyl chain lengths and fluoro-substitutions thereof, such as would result in an alteration to n-type semiconductivity, as compared to p-type conductivity of the unaltered composition. Similar effects can be achieved by introduction/insertion of electron deficient moieties, such as fluoro- and perfluoroaryl groups and various heterocycles. Known synthetic procedures can be used or modified as would be known to those skilled in the art made aware of this invention to provide a variety of thiophene cores, each with the appropriate insertions and/or fluoroalkyl substituents. However, for purposes such as processing and subsequent device fabrication, a preferred core has about 4–7 conjugated thiophene units. Likewise, $C_5$–$C_7$ fluoroalkyl substitution is preferred and can be accomplished using commercially-available reagents, but various other substitutions can be achieved through synthesis of the corresponding fluoroalkyl compounds. Thiophene core substitution and heterocycle insertion is, therefore, limited only by the desired degree of n-type semiconductivity.

A TFT device with, for instance, a DFH-6T active layer operates in the n-type accumulation mode, indicating DFH-6T and other such thiophene compounds are n-type conductors. Compared to prior art materials such as DH-6T and 6T, the new fluorinated thiophenes of this invention are significantly more chemically and thermally inert, and can be transported quantitatively into the vapor phase without decomposition. In the solid state, the inventive thiophene units have strong π-π intermolecular interactions. As described below, film growth morphologies can depend on growth temperature and substrate pretreatment and/or functionalization.

This invention demonstrates that fluoroalkyl functionalization of a thiophene core substantially enhances thermal stability, volatility, and electron affinity vs. the non-fluoro analogs and affords the first n-type thiophene for use, as an example, in a TFT. As a representative material of this invention, DFH-6T film morphology is sensitive to substrate temperature and surface pretreatment, with crystallite size increasing with increasing growth temperature. UV-vis/PL and XRD studies indicate that while DFH-6T has close intermolecular π-stacking, it is not isostructural with the DH-6T analog. Since thiophene oligomers of the prior art are typically p-type, the present invention using n-type semiconductors can provide a pathway by which an all-thiophene complementary circuit can be realized.

In accordance with the preceding, the present invention further includes thiophene systems such as those represented by general structural formulas 1–3, as can be prepared in high yield via palladium(0)-catalyzed coupling of haloaromatics with stannyl (Stille coupling) and Grignard reagents.

One embodiment of this invention includes various pre-fluoroalkyl and/or fluoroalkyl substituted thiophene oligomers or polymers, as can be represented by the structural formula

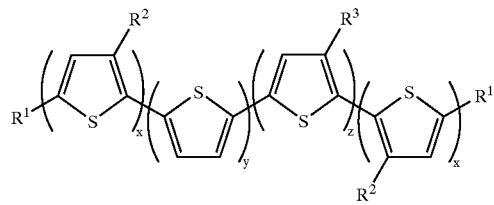

1 wherein $R_1$, $R_2$ and $R_3$ are selected from the substituent group consisting of fluoroalkyl moieties, $C_nH_{2n+1}$ and where n is about 1–12, H, F and $(CH_2)_aX$ and where a is about 1–12 and X is selected from the group consisting of amino, hydroxy and carboxylic acid functionalities; and x, y and z are integers from the group of integers consisting of 0 and integers greater than 0.

The fluoroalkyl moieties of such compositions can include but are not limited to the corresponding linear, branched and/or cyclic substituents, optionally in the presence of one or more alkyl and/or fluorine substituents. Alternatively, an alkyl substituent can further include a functional group including but not limited to those described in Examples 14 and 15, below, such that the resulting polythiophene composition can be further transformed and/or modified. Various other functional groups will be well known to those skilled in the art and made aware of this invention, as will be the corresponding synthetic techniques/procedures by which to effect such a transformation or polythiophene modification.

With respect to the aforementioned fluoroalkyl moieties, various properties of such compositions can be modified by alkyl length and extent of alkyl fluorination. Preferred compositions can include those with a fluoroalkyl moiety having the compositional formula $C_nF_{2n+1}$, where n is about 1–8. The compositions of such embodiments can be further modified by choice of integers x, y and z. Regardless of substitution, such preferred embodiments can also include those in which x is about 0–4, y is about 0–8 and z is about 0–12. However, it should be understood, in the broader context of this invention, that the composition of such polythiophenes and the number of conjugated thiophene units is limited only by synthetic technique.

Representative structures include but are not limited to the following:

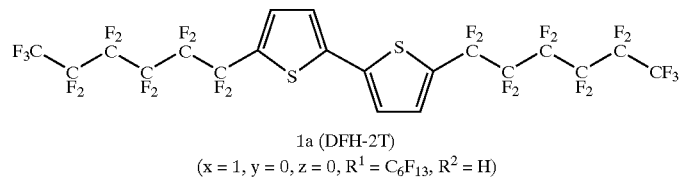

1a (DFH-2T)
(x = 1, y = 0, z = 0, $R^1$ = $C_6F_{13}$, $R^2$ = H)

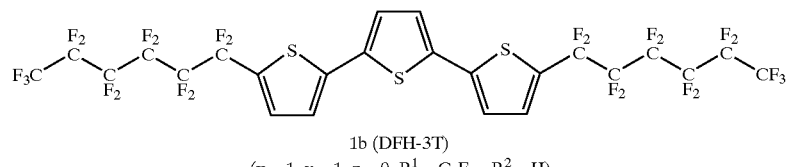

1b (DFH-3T)
(x = 1, y = 1, z = 0, $R^1$ = $C_6F_{13}$, $R^2$ = H)

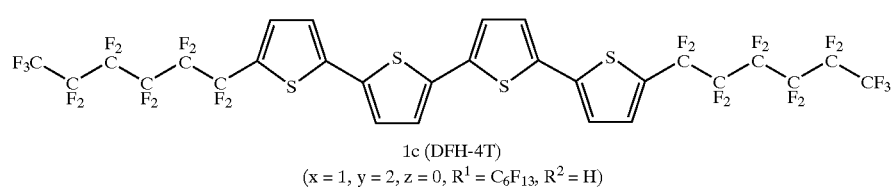

1c (DFH-4T)
(x = 1, y = 2, z = 0, $R^1$ = $C_6F_{13}$, $R^2$ = H)

-continued
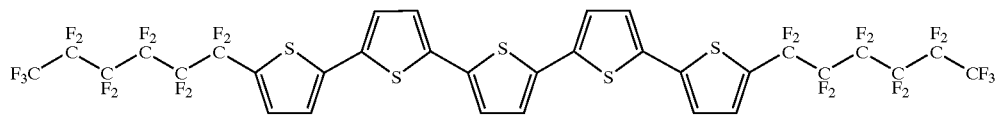
1d (DFH-5T)
(x = 1, y = 3, z = 0, R$^1$ = C$_6$F$_{13}$, R$^2$ = H)
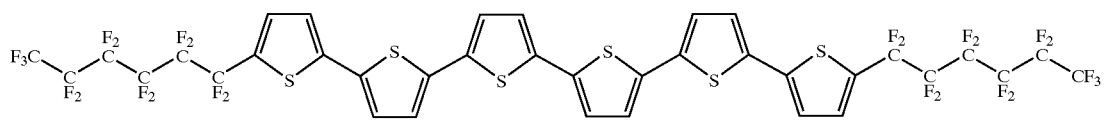
1e (DFH-6T)
(x = 1, y = 4, z = 0, R$^1$ = C$_6$F$_{13}$, R$^2$ = H)
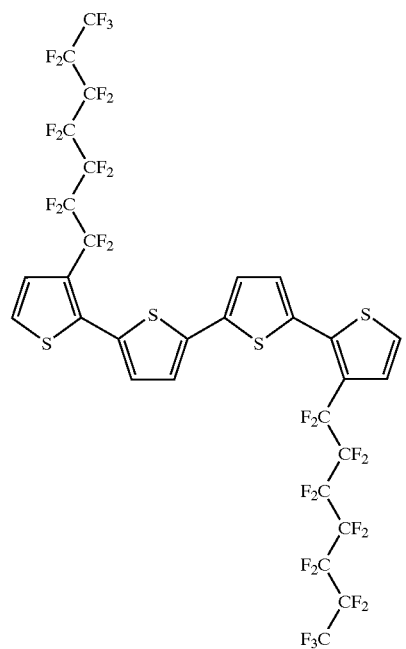
1f (isoDFH-4T)
(x = 1, y = 2, z = 0, R$^1$ = H, R$^2$ = C$_6$H$_{13}$)
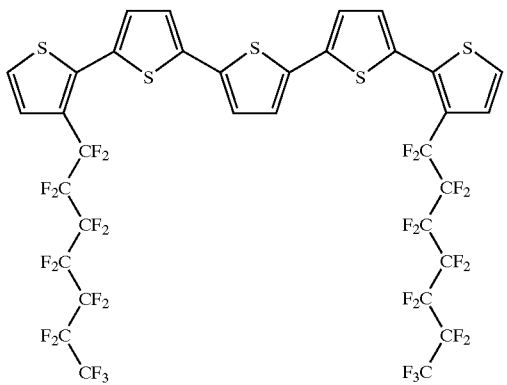
1g (isoDFH-5T)
(x = 1, y = 3, z = 0, R$^1$ = H, R$^2$ = C$_6$F$_{13}$)

-continued
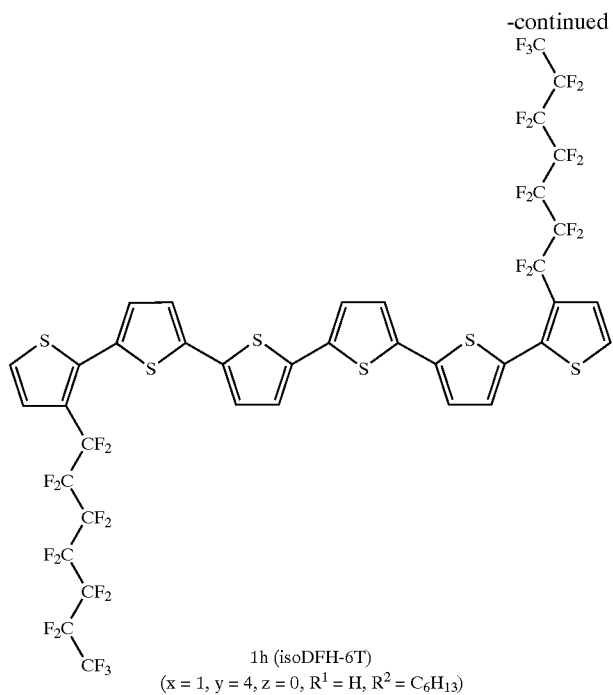
1h (isoDFH-6T)
(x = 1, y = 4, z = 0, R¹ = H, R² = C$_6$H$_{13}$)
Compositions 1a–h were prepared according to Schemes 1 and 2. (See, also, Examples 17 and 17a–g.)
Scheme 1
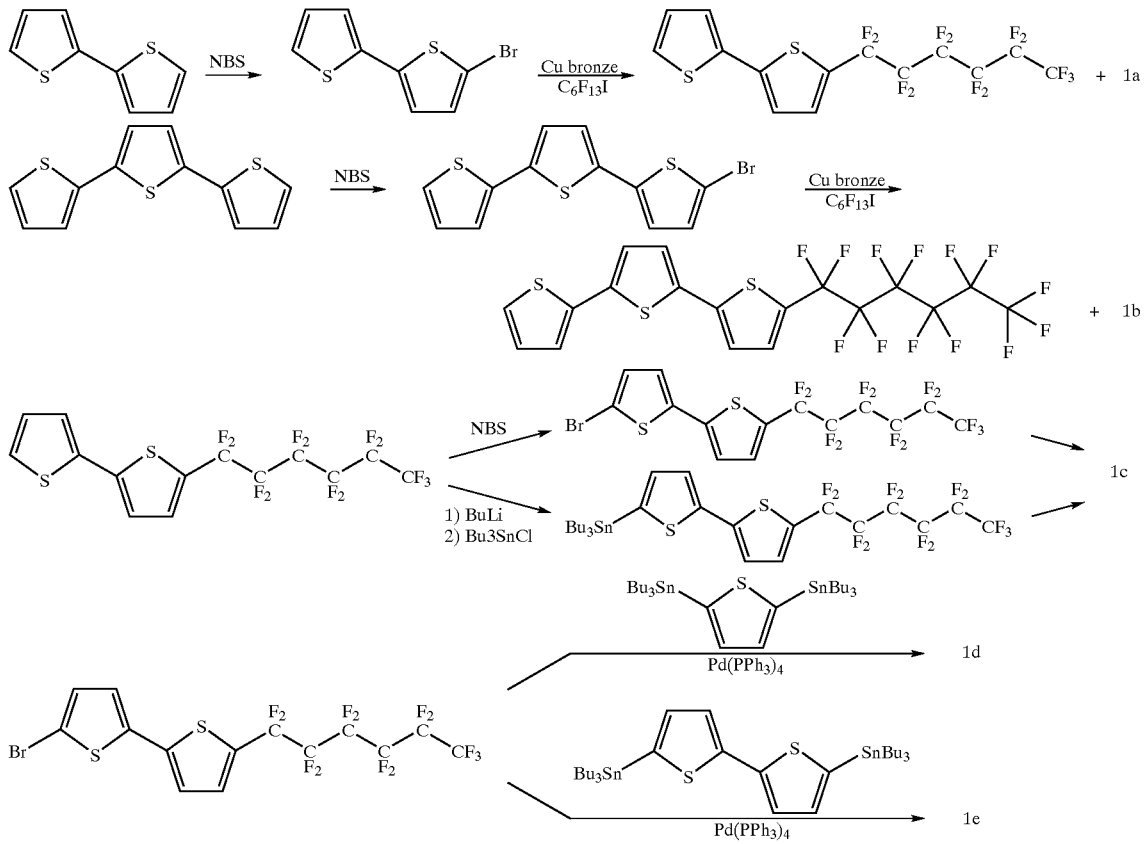

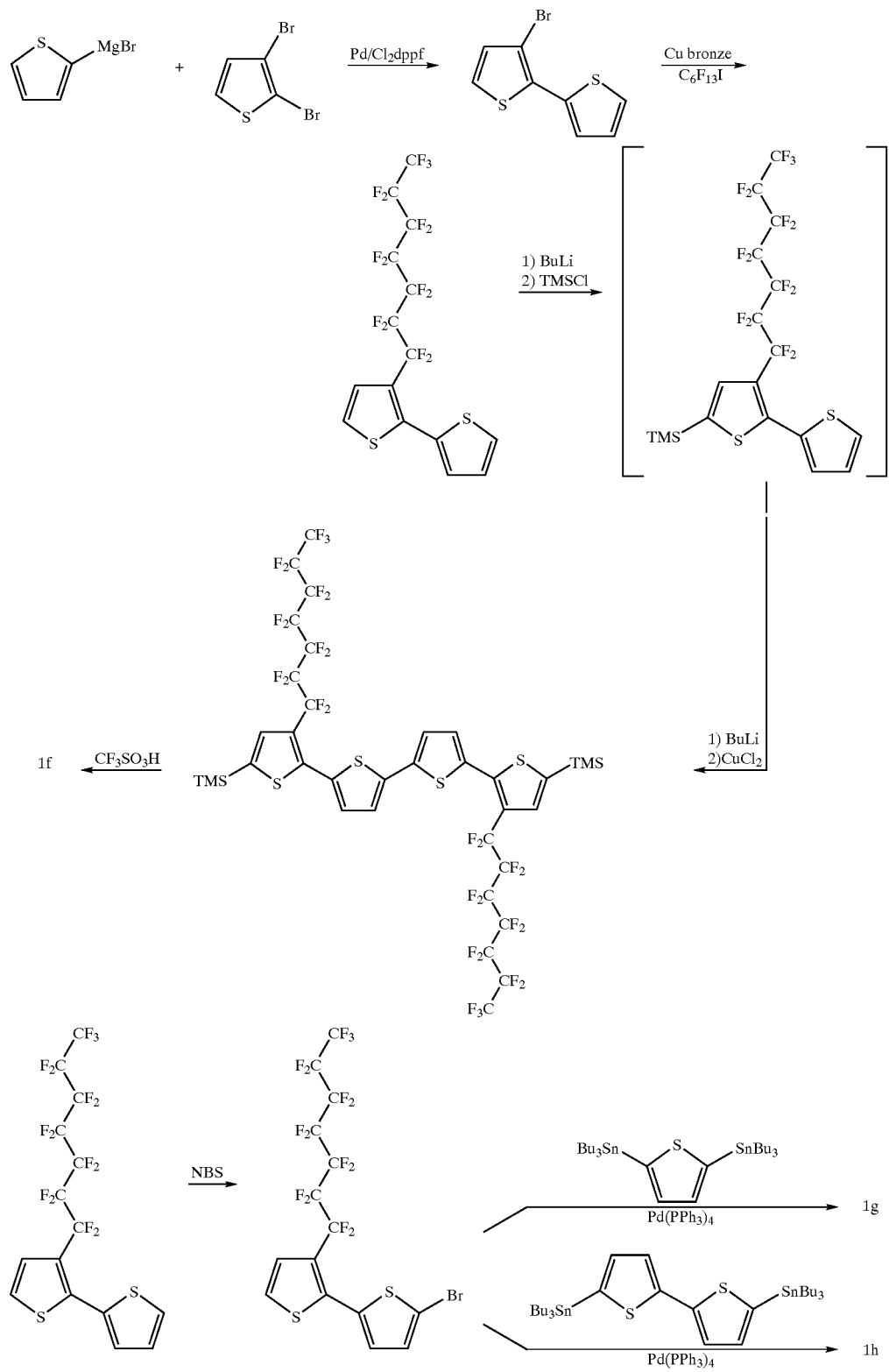

Another embodiment of this invention includes various π-conjugated perfluorophenyl-thiophene oligomers, as can be represented by the structural formula

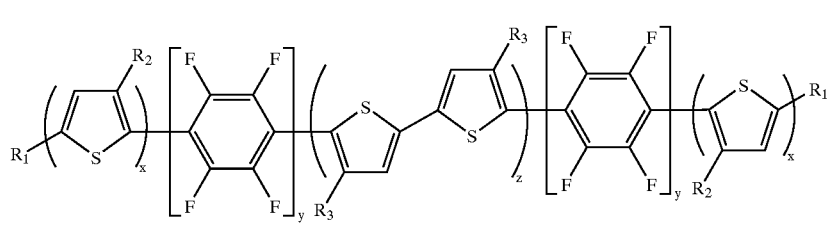

2 wherein $R_1$, $R_2$ and $R_3$ are selected from the substituent group consisting of fluoroalkyl moieties, $C_nH_{2n+1}$ and where n is about 1–12, H, F, and $(CH_2)_aX$ and where a is about 1–12 and X is selected from the group consisting of amino, hydroxy and carboxylic acid functionalities; and x, y and z are integers selected from the group of integers consisting of 0 and integers greater than 0.

The compositions of this embodiment and the chemical/physical properties corresponding thereto, can be modified as described above by choice and extent of thiophene substitution. In addition, as the present embodiment illustrates, the compositions of this invention can be further modified by insertion of perfluoroaryl components between conjugated thiophene units. Use thereof in combination with any of the aforementioned substitution parameters can provide a route to choice and design of compositions with specific electronic properties.

Representative structures include but are not limited to the following:

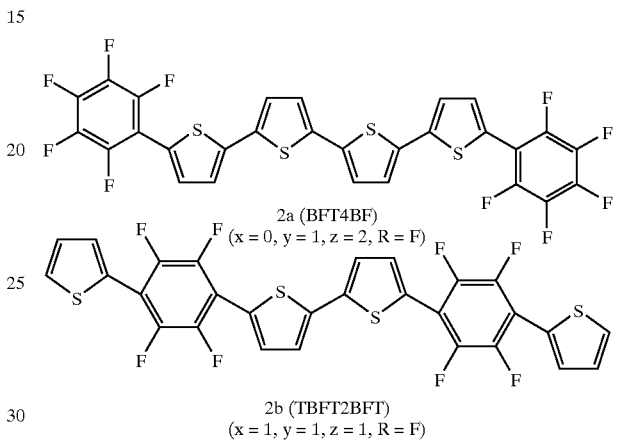

2a (BFT4BF)
(x = 0, y = 1, z = 2, R = F)

2b (TBFT2BFT)
(x = 1, y = 1, z = 1, R = F)

Compositions 2a–b were prepared according to Scheme 3. (See, also, Examples 18a–e.)

Scheme 3

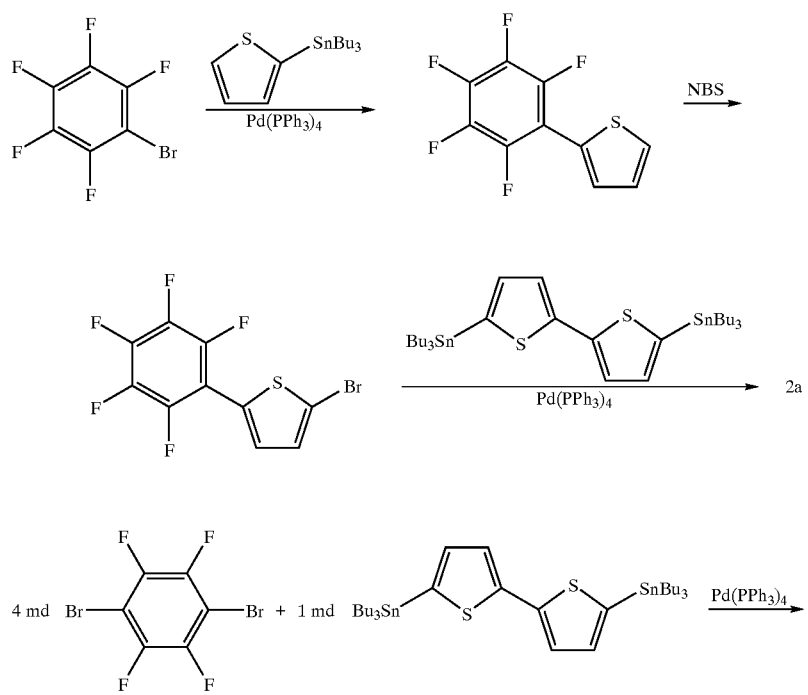

-continued

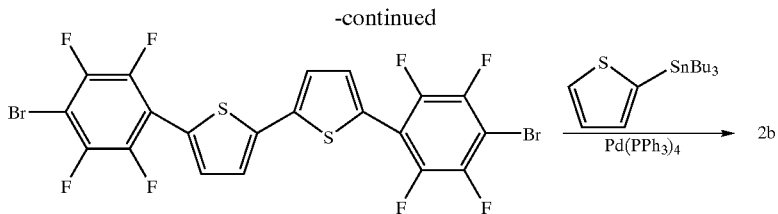

Another embodiment of the present invention includes various π-conjugated electron-poor heterocycle (including azine)-thiophene oligomers, as can be represented by the following structural formula

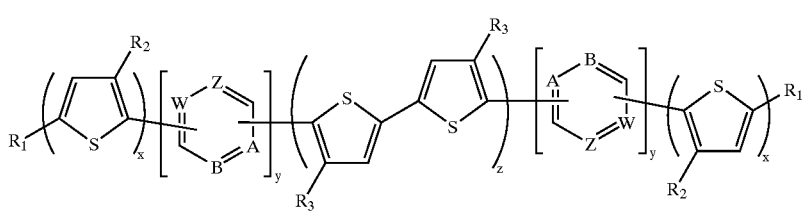

wherein $R_1$, $R_2$ and $R_3$ are selected from the substituent group consisting of fluoroalkyl moieties, $C_nH_{2n+1}$ and where n is about 1–12, H, F. and $(CH_2)_aX$ and where a is about 1–12 and X is selected from the group consisting of amino, hydroxy and carboxylic acid functionalities; x, y and z are integers selected from the group of integers consisting of 0 and integers greater than 0; and A, B, W and Z are selected from the group of moieties consisting of N and CH:

Modification of a polythiophene composition can also be achieved through insertion of a suitable heterocyclic component, the effect of which can be comparable to perfluoroaryl substitutions of the sort described above. Several such insertions are illustrated, below, but this embodiment can be extended to include other electron-deficient heterocycles including but not limited to thiadiazine and tetrazine. Polythiophene compositions including such components can be prepared through straight-forward extensions of the general synthetic techniques described herein, such extensions as would be understood by those skilled in the art. The electronic effect afforded such thiophene compositions by heterocycle insertion can be further tailored for a specific end-use application through choice and degree of substitution, as described more fully above. Accordingly, as with the preceding fluoroalkyl and perfluoroaryl compositions, the heterocyclic compositions of this embodiment can vary without limitation corresponding to substituent ($R_1$, $R_2$ and $R_3$), optional functional group (amino-, hydroxy- or carboxylic acid groups), heteroatom identity and/or number of thiophene and/or heterocyclic units.

Accordingly, as also described elsewhere herein, the present invention can further include a method of using thiophene structural modification to provide, promote and/or enhance n-type thiophene conductivity. Such a method includes (1) preparing a polythiophene composition having a plurality of conjugated thiophene components or moieties; (2) providing the composition a structural modification sufficient to promote n-type conductivity, such a modification selected from the group of structural modifications described above and including but not limited to fluoroalkyl substitution, fluorine substitution, fluoroaryl insertion, heterocycle insertion and combinations thereof. As described herein and as would be understood to those skilled in the art, such modifications can be made or provided en route to the preparation of such polythiophene compositions. Alternatively, various synthetic techniques, depending upon the desired modification, can be made subsequent thereto. Such modifications can provide a wide variety of polythiophene compositions, commensurate with the broad scope of this invention, such compositions including but not limited to those embodiments discussed above.

Representative structures include but are not limited to the following:

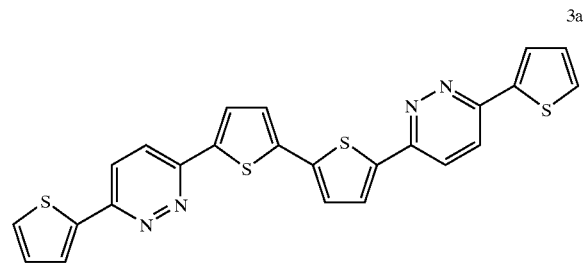

(TPDT2PDT)
(x = 1, y = 1, z = 1, R = H, A = B = N, C = Z = CH)

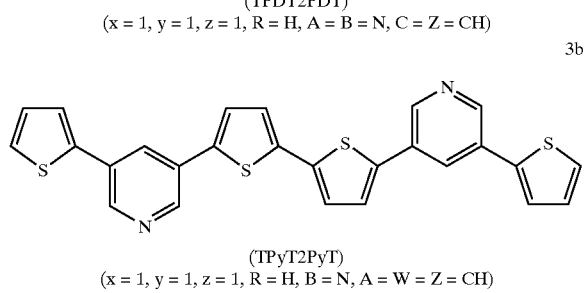

(TPyT2PyT)
(x = 1, y = 1, z = 1, R = H, B = N, A = W = Z = CH)

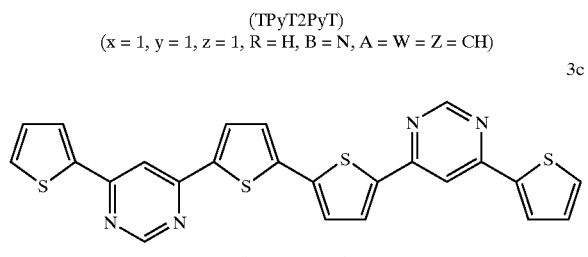

(TPMT2PMT)
(x = 1, y = 1, z = 1, R = H, A = W = N, B = Z = CH)

-continued

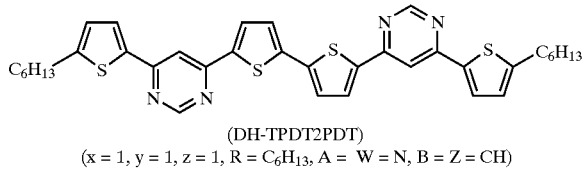

(DH-TPDT2PDT)
(x = 1, y = 1, z = 1, R = C$_6$H$_{13}$, A = W = N, B = Z = CH)

Compounds 3a–d were prepared according to Scheme 4. (See, also, Examples 19a–f).

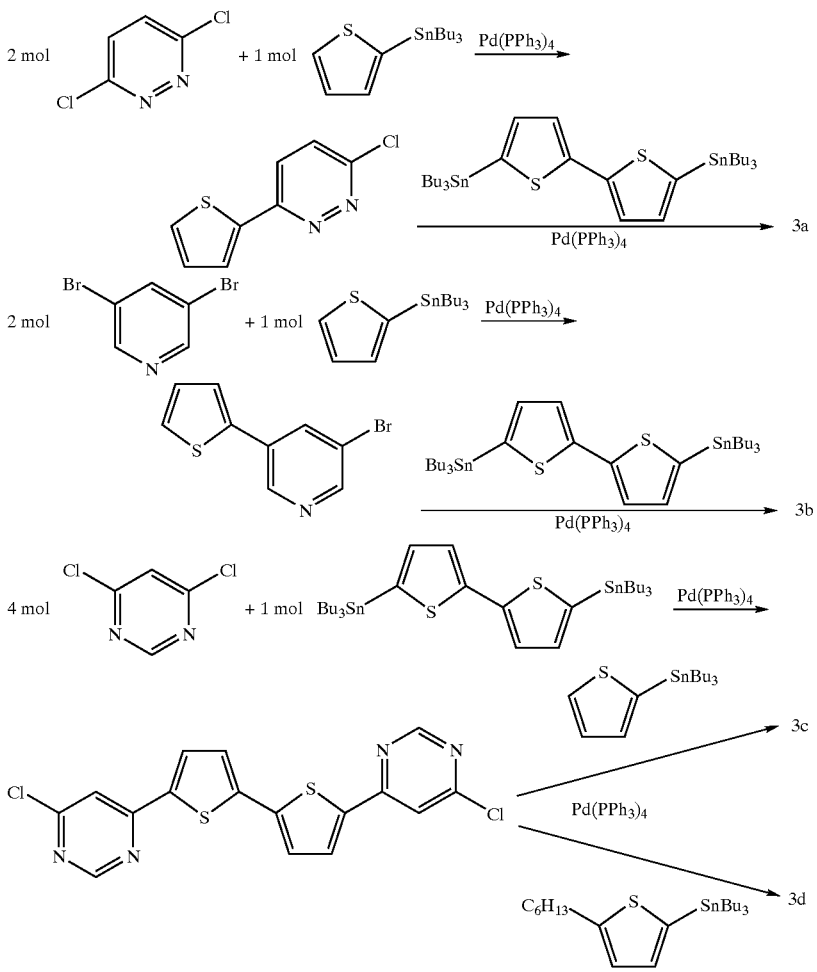

EXAMPLES OF THE INVENTION

The following non-limiting examples and data illustrate various aspects and features relating to the thiophene compounds, composites, materials and related methods and devices of this invention, and demonstrate their surprising and unexpected utility in the transport of electrons (n-type). Comparably utilities and advantages can be realized using various other embodiments consistent with this invention.

Example 1

Figure 1:
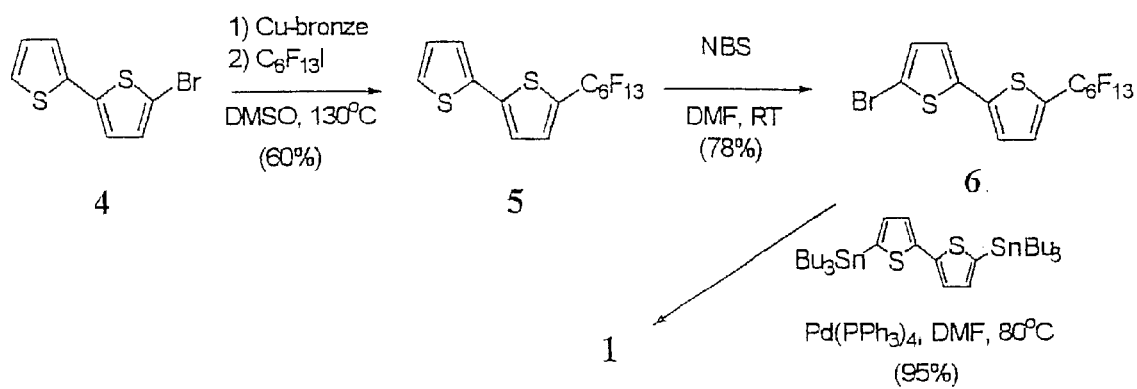
FIG. 1 shows schematically a synthetic procedure, in accordance with this invention, en route to a representative, but preferred n-type fluoroalkylthiophene material.

DFH-6T was synthesized in high yield via Pd$^0$-catalyzed Stille coupling of 5-bromo-5'-perfluorohexyl-dithiophene (6) with 5,5'-di(tributyl-stannyl)dithiophene (FIG. 1). This route affords DFH-6T (1) in high purity and yield (~95%) after multiple gradient sublimation. Note that although monosubstituted perfluoroalkyl thiophene oligomers up to three units have been reported, synthetic yields were typically ~10%. For example, 3'-perfluorohexylterthiophene was isolated in ~11% yield.

Example 2

Figure 2:
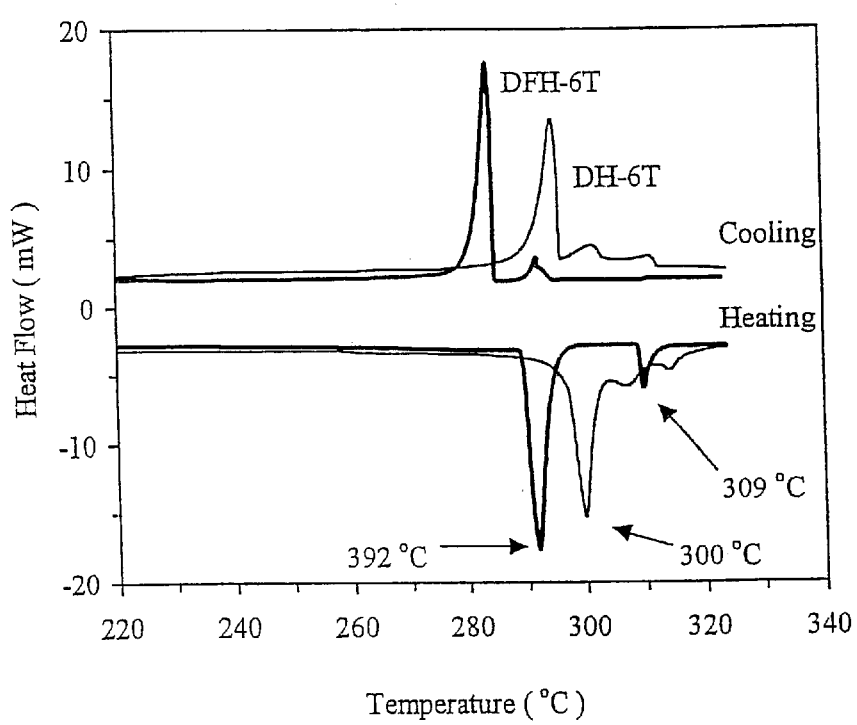
FIG. 2 shows DSC thermograms of DFH-6T (bold line) and DH-6T (fine line) under N$_2$. Temperature ramp=1.5° C./min.

The comparative thermal properties of DFH-6T and DH-6T were investigated by differential scanning calorimetry (DSC) and thermogravimetric analysis (TGA). In the DSC, both compounds exhibit at least one transition (FIG. 2). Compound DH-6T exhibits a distinct crystal-to-liquid crystal (LC) transition at 292° C. and a LC-to-isotropic transition at 309° C., while the literature shows crystal-to-LC transition of 2 (300° C.) falls just below the melting point, 308–313° C. These mesophase formation events are not surprising in view of the molecular architectures. However, the most interesting feature is that the two systems exhibit such similar thermal behavior and almost identical melting points, suggesting that strong DH-6T π-π interactions are preserved upon fluorine substitution.

Example 3

Figure 3:
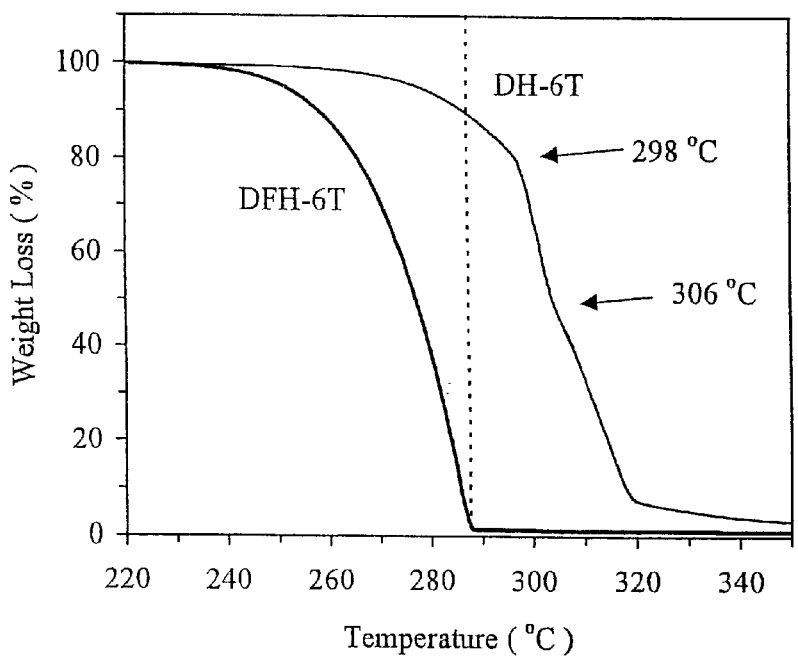
FIG. 3 shows reduced pressure (0.01 torr N$_2$) TGA comparison of the volatility characteristics of DHF-6T and DH-6T: weight loss comparison plots (A) for DH-6T and DFH-6T recorded at a ramp rate of 1.5° C./min; and isothermal data (B) collected at 260 and 290° C. for DFH-6T and DH-6T, respectively.
Figure 3:
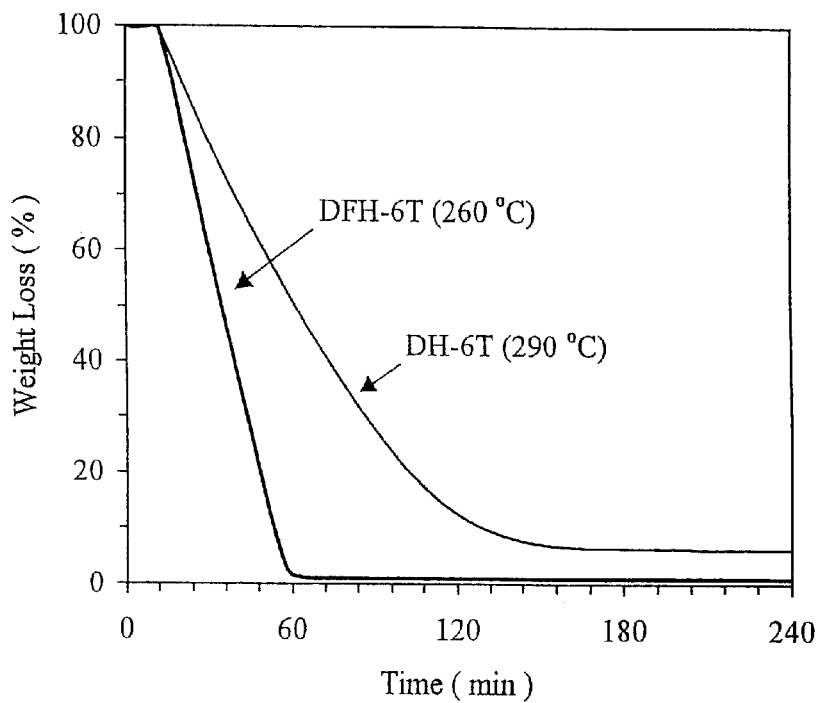

In contrast, the α,ω-fluorocarbon chains have a dramatic effect on the volatility of DFH-6T as shown by TGA (FIG. 3A). The monotonic % weight loss vs. T demonstrates smooth, clean, quantitative sublimation well below the melting point with negligible residue. In contrast, DH-6T exhibits significant volatility only above the melting point, with the TGA data revealing inflections at ~298 and ~306° C., suggesting decomposition processes. In addition, a significant decomposition-related residue (~6%) is observed at 320° C. The enhanced volatility of DFH-6T (vs. DH-6T) is further demonstrated by isothermal TGA (FIG. 3B) where DH-6T sublimation at the lowest possible temperature leaves ~8% decomposition residue.

Example 4

Figure 4:
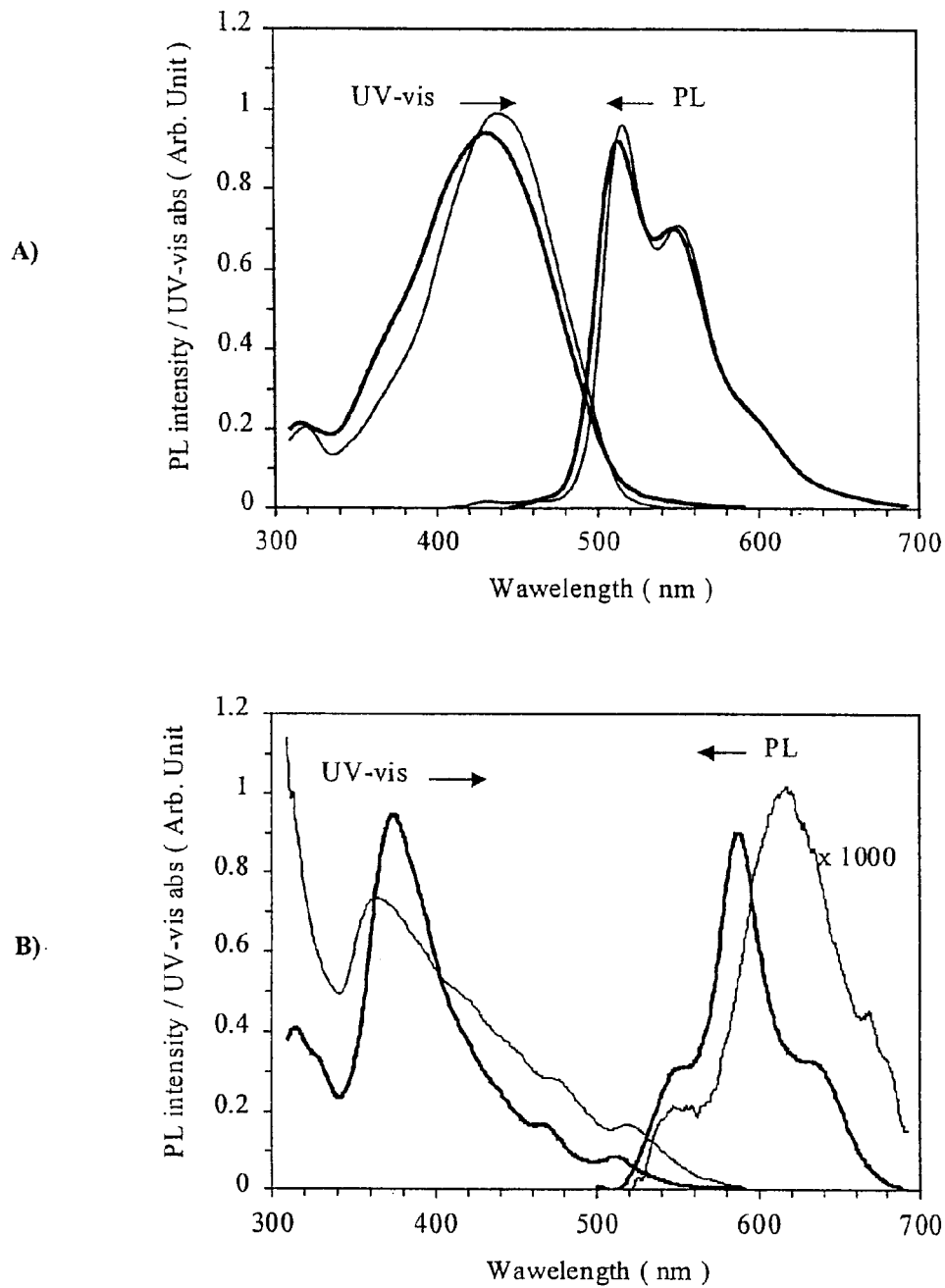
FIG. 4 shows optical absorption (UV-vis) and emission (PL) spectra of DFH-6T (bold-line) and DH-6T (fine line): (A) dilute toluene solution at ca. 80° C., solution PL excited at 444 nm (DFH-6T) and 436 nm (DH-6T); and (B) as thin films (~1.8 μm) on glass substrates, film PL spectra excited at 377 nm,(DFH-6T) and 363 nm (DH-6T).

FIG. 4 shows optical absorption and emission (PL) spectra of DFH-6T and DH-6T in solution (FIG. 4A) and as thin vapor-deposited films (FIG. 4B). Remarkably, the solution spectra are nearly superimposable, arguing that the energy differences between ground and excited states of the 6T core are only marginally sensitive to α,ω-substitution and that the HOMO-LUMO gaps of ~2.4 eV are nearly identical. The spectra of the films exhibit both differences and similarities. First, both PL spectra have a central peak and two weaker shoulders. The high energy shoulders fall, for both systems, at the same wavelength near the tail of the absorption, yielding estimated film HOMO-LUMO gaps of ~2.2 eV. However, while DFH-6T exhibits strong green fluorescence ($\lambda_{max}$~588 nm) under UV excitation, the DH-6T emission intensity is several orders of magnitude weaker and red-shifted by ~30 nm. The low PL yields of the prior art DH-6T (2) and 6T (3) thin films and blue-shifted absorption maxima vs. solution were previously ascribed to Davydov splitting. The origin of the DFH-6T blue-shifted absorption and enhanced PL efficiency is unknown and warrants further study. While both DH-6T and DFH-6T exhibit strong intermolecular π-π interactions, they are not isostructural (vide infra).

Example 5

The electronic consequences of DH-6T fluoroalkyl substitution were also investigated by cyclic voltammetry (one-compartment cell with a Pt working electrode, Ag/0.1M AgNO$_3$ (CH$_3$CN) reference, Ag counter electrodes). The Ag/AgNO$_3$ reference electrode was calibrated against ferrocene/ferrocinium ($E_{e,fra\ 1/2}$=0.042 V). Voltammograms of DFH-6T and DH-6T in CHCl$_3$/0.10M TBABF$_4$ exhibit two chemically irreversible oxidative waves at +0.68/+0.88 V and +0.41/+0.61 V, respectively, and negligible reductive features, indicating chemically irreversible oxidative processes likely related to polaron and bipolaron formation. The first and second anodic peaks of DFH-6T vs. DH-6T exhibit a uniform anodic potential shift (~+0.27 V), indicating that introduction of perfluoroalkyl chains on the 6T core substantially increases the ionization potential.

Example 6

Figure 5:
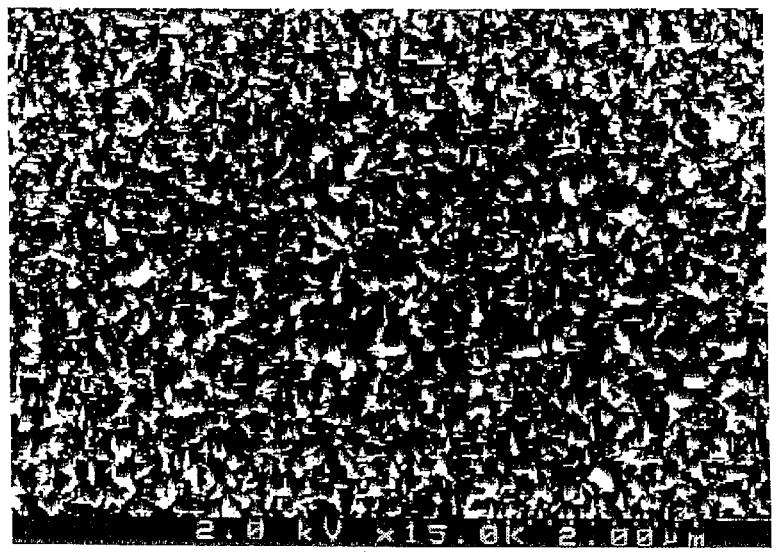
FIG. 5 provides plan view SEM images of 100 nm thick DFH-6T films deposited at various substrate temperatures on silicon: (A) 25° C., (B) 85° C., and (C) 145° C.
Figure 5:
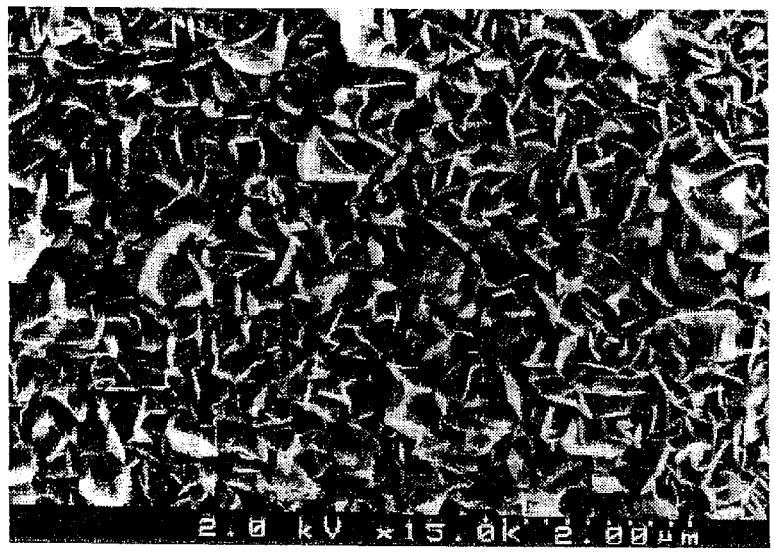
Figure 5:

SEM reveals DFH-6T film growth depends significantly on substrate temperature and surface pretreatment. Films deposited at 25° C. consist of small crystalline grains (~80×50 nm$^2$) resulting from rapid condensation on the cold substrate (FIG. 5A), while growth at 85° C. (FIG. 5B) affords elongated grains with larger dimensions (~500×60 nm$^2$) and random orientation. Growth at 145° C. yields larger crystallites (FIG. 5C: ~1000×350 nm$^2$), however film morphology is less smooth, probably because DFH-6T volatility prevents uniform adsorption on the hot surface. The influence of substrate temperature on crystallite size and film morphology for other thiophene semiconductors such as 6T is known to be related to nucleation site density, growth rate, and surface free energy phenomena during growth. Because Si/SiO$_2$ has a hydrophilic native oxide layer, the surface is not ideal for deposition of a hydrophobic adsorbate. Thus, substrates were also pretreated with $CF_3(CF_2)_5CH_2CH_2SiCl_3$ to produce a fluorocarbon monolayer. The crystallite dimensions are increased by ~10% and grain-to-grain, grain-to-substrate interconnections are visibly enhanced. Various other substrate materials known to those skilled in the art can be used in conjunction with this invention, not only to further demonstrate the utility shown in this example, but also in the various composites and electronic devices described elsewhere herein.

Example 7

X-ray diffraction (Cu $K_\alpha$) scans of DFH-6T films grown at various temperatures (FIG. 6) reveal that higher crystalline order is achieved as the substrate temperature is increased to 200° C. Annealing at 240° C. further enhances microstructural alignment, with the dominant Bragg features assignable to a family of (n00) reflections corresponding to a real-space periodicity of 36.1+0.2 Å, close to the DFH-6T long axis dimension. Although the crystal structure of DFH-6T has not been determined, the XRD data suggest preferential molecular orientation with long axes along the substrate normal, in which case transport in the plane of the film would benefit from close π-π stacking. Note that DFH-6T films grown on $CF_3(CF_2)_5CH_2CH_2SiCl_3$-treated Si substrates exhibit sharper XRD reflections, indicating highly ordered films. Finally, powder diffraction reveals that DFH-6T and DH-6T are not isostructural, with different unit cell arrangements expected in view of the different packing properties of hydrocarbon vs. perfluorocarbon chains.

Example 8

Demonstrating use of the present invention in conjunction with a thin film as part of a field effect transistor (FET), field-effect measurements were carried out on top contact TFTs with 30–100 nm DFH-6T films deposited at <$10^{-6}$ mbar and at ~0.5–1.0 Å/s onto n$^+$-Si FET substrates with a 230 nm dry thermal $SiO_2$ insulating layer. The substrate temperature was varied between 50° C.–120° C. Prior to DFH-6T deposition, the $SiO_2$ surface was silylated with hexamethyldisilazane or $CF_3(CF_2)_5CH_2CH_2SiCl_3$; both yielded similar TFT results. The devices were completed by evaporating Au or Al source-drain contacts on the DFH-6T. Device characteristics were measured under $N_2$ with an HP parameter analyzer. FIG. 7(a) shows characteristics of a typical DFH-6T FET with Au S-D contacts (channel length L=75 μm, channel width W=1.5 mm). Transistor action is observed only for positive gate voltages ($V_g$>0) indicating an accumulation layer of mobile electrons is formed at the DFH-6T-$SiO_2$ gate dielectric interface. No transistor action is induced by applying a negative gate voltage. Previously, only p-type accumulation ($V_g$<0) has been observed in TFTs of alkyl-substituted and unsubstituted olio- and polythiophene derivatives. The positive signs of both gate voltage ($V_g$ and source drain current ($I_d$) show that DFH-6T is a new n-type semiconductor. The present n-type conduction doubtless reflects the greater electron affinity of the fluoro alkyl-substituted sexithiophene.

It is remarkable, surprising and unexpected that this relatively minor substituent-related change is sufficient to dramatically alter thin-film semiconducting properties from p- to n-type. The only other example of such a majority carriers sign inversion is the unrelated phthalocyanine→perfluorophthalocyanine system. However, DFH-6T and M($F_{16}$Pc) differ markedly in the nature of substituent effects, and the inversion observed here would not be expected. In the M($F_{16}$Pc) system, extensive C-H →C-F substitution leads to a large electronic perturbations of the core structure. Furthermore, the nature of the substituents differs. Whereas perfluoroalkyl chains exhibit only strong σ-inductive electron-withdrawing effects (–I), F atoms attached directly to π-systems exhibit both donating-resonance (+R) and attracting-inductive (–I) characteristics.

Example 9

Figure 7:
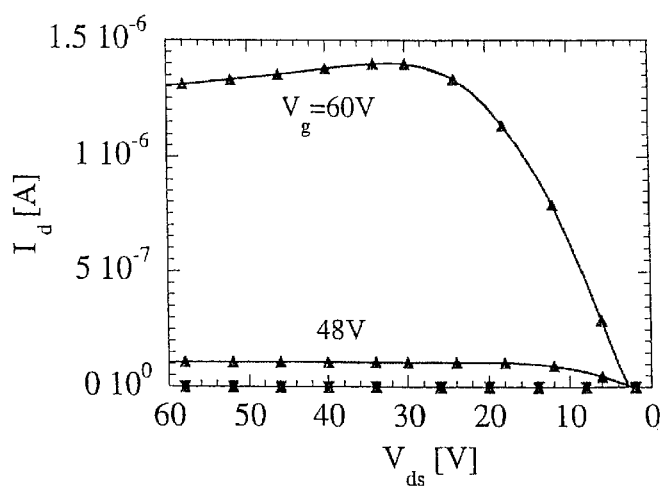
FIG. 7 plots graphically (A) source drain current vs. voltage characteristics of DFH-6T TFTs (top contact configuration) at different gate voltages, and (B) source drain current vs. gate of DFH-6T TFTs.
Figure 7:
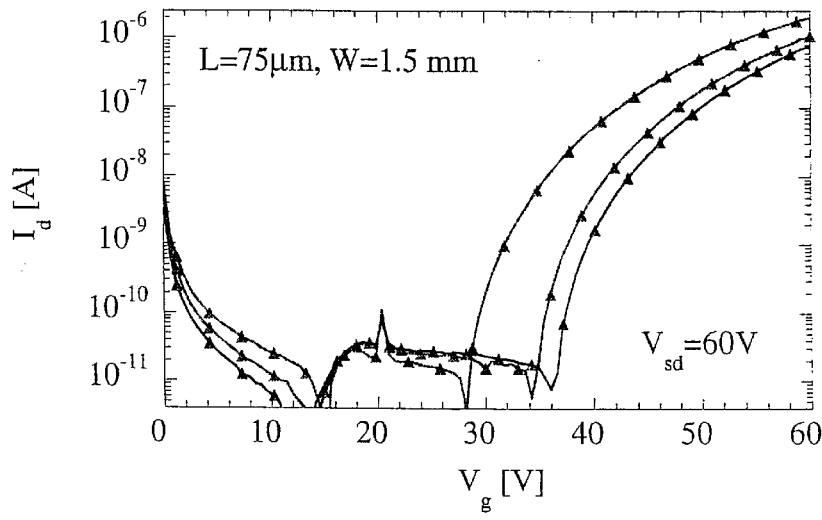

The device of FIG. 7 was fabricated with Au source-drain contacts. Devices with Al contacts exhibit similar characteristics, which is surprising considering the significantly higher Au work function (5.1 eV) vs. Al (4.3 eV), implying, a priori, a higher barrier for electron injection from Au. Values for the field-effect mobility were determined from the transfer characteristics in the saturation regime (FIG. 7b). The highest mobilities of 0.02 cm$^2$NVs $$\frac{dI_d}{dV_g} = \frac{C_i \cdot W}{L} \cdot \mu_{FET}^{sat}(V_g) \cdot (V_g - V_T)$$

were obtained for film growth at 80–100° C. For growth temperatures ~50°, significantly lower mobilities (<$10^{-4}$ cm$^2$/Vs) are observed, and for temperatures ~120° C., a reduced mobility is obtained. This optimum substrate temperature doubtless reflects, among other factors, the grain size distribution temperature dependence in the polycrystalline film. The on/off ratio in these DFH-6T devices is as high as $10^5$. The devices exhibit relatively high turn-on voltages $V_o$ of 25–35V, indicating a certain fraction of the induced electron carriers occupies localized trap states. The turn-on voltage increases further during operation. This results in a decrease of the TFT ON-current as a function of time which manifests itself in a non-ideal negative slope of the output characteristics in the saturation regime (FIG. 7(a)). The turn-on-voltage can be somewhat reduced and stabilized by post-growth annealing (FIG. 7(b)).

Example 10

With reference to FIG. 1, the reagents 5-bromo-2,2'-dithiophene (4), and 5,5'-bis(tri-n-butylstannyl)-2,2'-dithiophene were prepared according to known synthetic procedures. Other solvents and reagents were purchased from the Aldrich or Lancaster concerns and purified as required.

Example 11

5-Perfluorohexyl-2,2'-dithiophene (5). A suspension of Cu bronze (3.38 g, 53.16 mmol) in dry DMSO (30 mL) was heated at 125° C. for 15 min under nitrogen. Perfluorohexyl iodide (11.34 g, 25.43 mmol) was added dropwise in such a way as to keep the temperature below 135° C. After 45 min, a solution of 5-bromodithiophene (2.50 g, 10.17 mmol) in the same solvent (7.0 mL) was added dropwise, and the reaction mixture was stirred at 125° C. for 16 h. The reaction was next quenched with cold water (100 mL) and diethyl ether was added (200 mL). After shaking, the mixture was filtered through Celite and the organic phase collected. The aqueous layer was extracted once more with ether (100 mL) and the two organic phases were combined, washed with water, and dried over $MgSO_4$. After filtration, the solvent was evaporated to yield a solid (5.18 g) which was chromatographed on silica gel (hexane) to afford pure product as a yellowsolid (2.90 g, 5.99 mmol, 58.9% yield). M.p. 51–53° C. (MeOH); $^1$H NMR (CDCl$_3$): δ 7.31–7.37 (2H, m), 7.28 (1H, d, $^2$J=3.6), 7.18 (1H, d, $^2$J=3.7), 7.06 (1H, dd);

$^{19}$F NMR (CDCl$_3$): δ −81.07 (3F), −101.64 (2F), −121.83 (4F, broad), −123.11 (2F), −126.43 (F). Anal. Calcd for C$_{14}$H$_5$F$_{13}$S$_2$: C, 34.72; H, 1.04; F, 51.00. Found: C, 34.96; H, 0.99; F, 49.95; HRMS (EI, 70 eV): found m/z 483.9626, calcd for C$_{14}$H$_5$F$_{13}$S$_2$ (M$^+$) 483.9625.

Example 12

5-Perfluorohexyl-5'-bromo-2,2'-dithiophene (6). With exclusion of light, NBS (1.02 g, 5.73 mmol) was added to a solution of 5-perfluorohexyldithiophene (2.32 g, 4.79 mmol) in DMF (32 mL). After stirring overnight at 25° C., the reaction mixture was poured into brine (120 mL), and the solution then extracted with ether (3×100 mL). The organic phase was next washed with water, dried over MgSO$_4$, filtered, and the solvent evaporated to afford 2.60 g of crude product. Flash chromatography on silica gel (hexane) afforded the title compound as a light yellow solid (2.10 g, 3.73 mmol, 77.8% yield). Sublimation (50° C./10$^{-3}$ Torr) afforded a purer sample. M.p. 63–65° C.; $^1$H NMR (CDCl$_3$) δ 7.34 (1H, d,), 7.12 (1H, d, $^2$J=3.1), 7.03 (1H, d, $^2$J=3.3), 7.01 (1H, d); $^{19}$F NMR (CDCl$_3$) δ −81.07 (3F), −101.64 (2F), −121.83 (4F, broad), −123.11 (2F), −126.43 (2F). (fluorine NMR to be recorded). Anal. Calcd for C$_{14}$H$_4$BrF$_{13}$S$_2$: C, 29.86; H, 0.72; F, 43.86. Found: C,; H,; F,; HRMS (EI, 70 eV): found m/z 563.8721, calcd for C$_{14}$H$_4$BrF$_{13}$S$_2$ (M$^+$) 563.8709.

Example 13

αω-Diperfluorohexyl-sexithiophene, DFH-6T (1e). A mixture of 5,5'-bis(tri-n-butylstannyl)-2,2'-dithiophene (1.40 g, 1.88 mmol), 5-perfluorohexyl-5'-bromo-2,2'-dithiophene (2.00 g, 3.55 mmol) and Pd(PPh$_3$)$_4$ (0.050 g, 0.040 mmol) in dry DMF (40 mL) was deareated twice with nitrogen. The reaction mixture was then heated at 80° C. for 7 h during which time a precipitate formed. After cooling, the bright orange solid was collected and washed several times with hexane, methanol, and acetone to afford the analytically pure product (1.91 g, 1.69 mmol, 95.2% yield). M.p. 309° C. Additional purification can be achieved by gradient sublimation. Anal. Calcd for C$_{36}$H$_{12}$F$_{26}$S$_6$: C, 38.24; H, 1.07; F. 43.69. Found: C, 38.16; H, 1.15; F, 43.42; MS (EI, 70 eV) 1127.4 (M$^+$, 70%).

Example 14

With reference to structure 7, below, the compounds of this example further illustrate the thiophene compositions, materials and/or films of the type available through this invention. (X is a functional group of the sort described in Example 15, and a=0–12.)

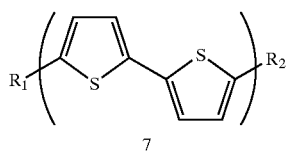

7

| N | R$_1$ | R$_2$ |
|---|---|---|
| 7a | 1 | C$_6$F$_{13}$ | C$_6$F$_{13}$ |
| 7b | 1.5 | CF$_3$ | C$_2$H$_4$X |
| 7c | 3 | C$_4$H$_9$ | CF$_3$ |

-continued

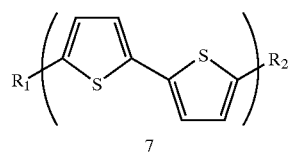

7

| N | R$_1$ | R$_2$ |
|---|---|---|
| 7d | 4 | C$_3$F$_7$ | (CH$_2$)$_a$X |
| 7e | 5–6 | C$_2$F$_5$ | C$_8$F$_{17}$ |

Example 15

In general, the olio- and/or polythiophene compounds of this invention including those of and represented by the preceding example are prepared in accordance with the synthetic procedures described herein and straight-forward modifications thereof. Substitution of 5-halo-2,2'-dithiophene with a suitable fluorocarbon provides one intermediate (a). Alternatively, the monohalodithiophene can be halogenated through known techniques for subsequent fluorocarbon substitution at both the 5 and 5' positions, such a dithiophene for use as described herein, as an n-type semiconducting material.

Yet another embodiment of this example contemplates substitution at the 5' position, and fluoroalkylation at the 5 position to provide a second intermediate (b). The 5' substituent introduces an aromatic or alkyl moiety including but not limited to amino, hydroxyl and/or carboxylic functional groups for later possible synthetic transformation. Intermediates (a) and/or (b) of this example are coupled with a stannyl (mono- or -bis-) thiophene (mono- or -di-), or further reacted with another intermediate of the type described herein to provide a range of conjugated thiophene units, with the desired degree of fluoroalkylation and/or alternate functionalization.

Example 16

Figure 8:
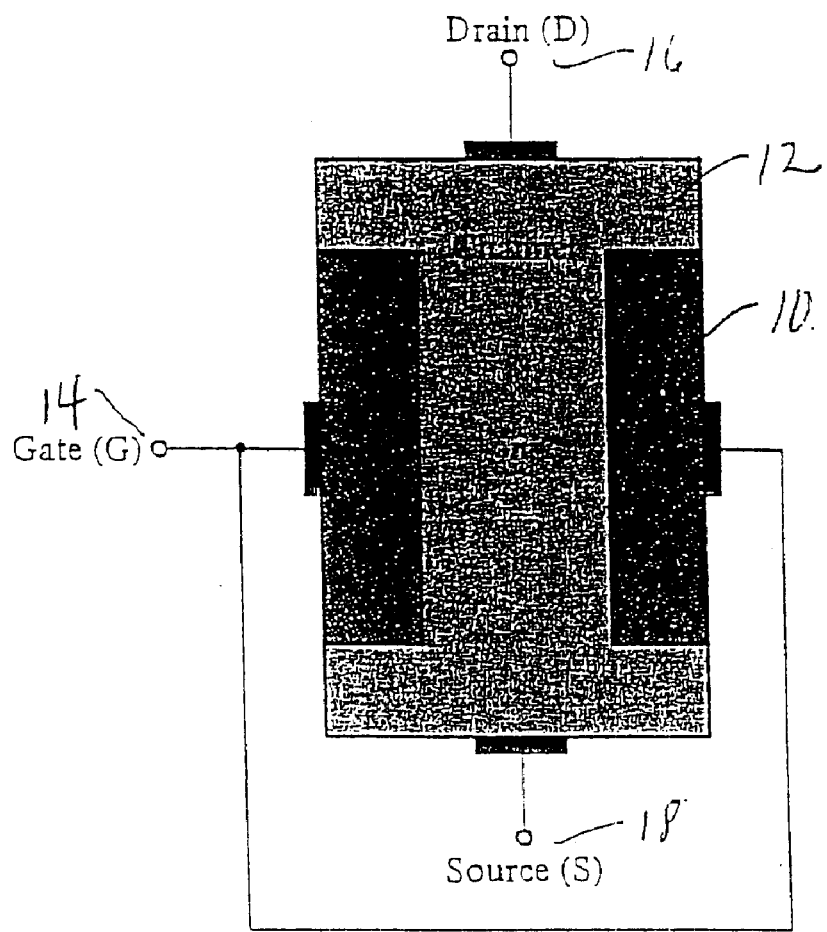
FIG. 8 schematically illustrates several transistor and related integrated circuit devices including therein, in accordance with this invention, a polythiophene thin film of the type described herein.

FIG. 8 illustrates incorporation of a thiophene semiconductor material of the present invention in an n-channel junction field-effect transistor (JFET). The JFET includes a gate region 10 constructed from a p-type semiconductor material and a channel 12 constructed from an n-type thiophene thin film deposited on a suitable substrate. (As mentioned above, the material of region 10 can be a p-type thiophene semiconductor.) In this device, a voltage applied to a gate electrode 14 controls current flow through the thin film/substrate composite of channel 12 between the drain electrode 16 and the source electrode 18. One of ordinary skill in the art can similarly apply a thiophene material of the present invention in a number of other transistor applications to provide without limitation p-channel JFETs, bipolar junction transistors of both the npn and pnp type, depletion and enhancement mode MOSFETS of both n and p channel types, and other types of transistors and integrated circuits.

Example 17

The reagents 5-bromo-2,2':5'2''-terthiophene, 5-bromo-2, 2'-dithiophene, and 5,5'-bis(tri-n-butylstannyl)-2, 2'dithiophene were prepared according to known procedures. Solvents and chemicals were purchased from Aldrich or Lancaster and purified as required.

Example 17a

5-Perfluorohexyl-2,2':5',2''-terthiophene and 5,5'-diperfluorohexyl-2.2':5',2''-terthiophene.

A suspension of copper bronze (1.01 g, 15.9 mmol) in dry DMSO (10 mL) was heated at 125° C. for 15 min under nitrogen. Perfluorohexyl iodide (3.40 g, 7.62 mmol) was then added dropwise in such a way as to keep the temperature below 135° C. After 45 min, a warm solution of 5-bromoterthiophene (1.00 g, 3.05 mmol) in the same solvent (10 mL) was added in a single portion, and the reaction mixture was stirred at 125° C. for 14 h. Distilled cold water (60 mL) was next added to the reaction flask and the resulting precipitate was collected on a Buchner funnel, washed several times with water, and finally dried overnight under vacuum. The crude product (1.40 g) was obtained from this solid by extraction with chloroform (3×50 mL). Column chromatography on silica gel (hexane) afforded the pure fluorinated product (0.76 g, 1.34 mmol, 43.9% yield) as a light yellow solid. M.p. 158° C. (iPrOH); $^1$H NMR (CDCl$_3$) δ 7.36 (1H, d, $^2$J=3.8), 7.28 (1H, d, $^2$J=3.6), 7.22 (1H, d, $^2$J=3.7), 7.15–7.19 (2H, m), 7.12 (1H, d, $^2$J=3.8), 7.06 (1H, dd); $^{19}$F NMR (CDCl$_3$) δ −81.10 (3F), −101.63 (2F), −121.89 (4F, broad), −123.10 (2F), −126.44 (2F). Anal. Calcd for C$_{18}$H$_7$F$_{13}$S$_3$: C, 38.17; H, 1.25; F, 43.61. Found C, 37.95; H, 1.18; F, 44.01; HRMS (EI, 70 eV): found m/z 565.9501, calcd for C$_{18}$H$_7$F$_{13}$S$_3$ (M$^+$) 565.9502. 5,5'-diperfluorohexyl-2,2':5',2''-terthiophene was obtained as byproduct (0.18 g, 0.201 mmol, 6.7% yield). M.p. 132° C. (toluene); $^1$H NMR (CDCl$_3$) δ 7.38 (3H, d, $^2$J=3.4), 7.22 (2H, d), 7.21 (2H, s); $^{19}$F NMR (CDCl$_3$) δ −81.08 (6F), −101.61 (4F), −121.90 (8F, broad), −123.07 (4F), −126.43 (4F). Anal. Calcd for C$_{24}$H$_6$F$_{26}$S$_3$: C, 32.59; H, 0.685; F, 55.85. Found: C, 32.50; H, 0.69; F, 55.63; HRMS (EI, 70 eV): found m/z 883.9226, calcd for C$_{24}$H$_6$F$_{26}$S$_3$ (M$^+$) 883.9217.

Example 17b

5-Perfluorohexyl-2,2'-dithiophene and 5,5'-diperfluorohexyl-2,2'-dithiophene. A suspension of copper bronze (3.38 g, 53.16 mmol) in dry DMSO (30 mL) was heated at 125° C. for 15 min under nitrogen. Perfluorohexyl iodide (11.34 g, 25.43 mmol) was added dropwise in such a way as to keep the temperature below 135° C. After 45 min, a solution of 5-bromodithiophene (2.50 g, 10.17 mmol) in the same solvent (7 mL) was added dropwise, and the reaction mixture was stirred at 125° C. for 16 h. The reaction was next quenched with cold water (100 mL) and diethyl ether was added (200 mL). After shaking, the mixture was filtered through Celite and the organic phase collected. The aqueous layer was extracted once more with ether (100 mL) and the two organic phases were combined, washed with water, and dried over MgSO$_4$. After filtration, the solvent was evaporated to give a solid (5.18 g) which was chromatographed on silica gel (hexane) to afford two products. 5,5'-diperfluorohexyl-2,2'-dithiophene (0.70 g, 0.87 mmol, 8.6% yield) as a white solid. mp=97° C. (toluene); $^1$H NMR (CDCl$_3$) δ 7.41 (2H, d, $^2$J=3.5), 7.27 (1H, d); $^{19}$F NMR (CDCl$_3$) δ −81.05 (6F), −101.90 (4F), −121.72 (4F), −121.89 (4F), −123.09 (4F), −126.41 (4F). Anal. Calcd for C$_{20}$H$_4$F$_{26}$S$_2$: C, 29.94; H, 0.50; F, 61.57. Found: C, 29.90; H, 0.57; F, 61.73; HRMS (EI, 70 eV) found m/z 801.9336, calcd for C$_{20}$H$_4$F$_{26}$S$_2$ (M$^+$) 801.9334. The monosubstituted system was isolated as a yellow solid (2.90 g, 5.99 mmol, 58.9% yield). M.p. 51–53° C. (MeOH); $^1$H NMR (CDCl$_3$) δ 7.31–7.37 (2H, m), 7.28 (1H, d, $^2$J=3.6), 7.18 (1H, d, $^2$J=3.7), 7.06 (1H, dd); $^{19}$F NMR (CDCl$_3$) δ −81.07 (3F), −101.64 (2F), −121.83 (4F, broad), −123.11 (2F), −126.43 (F). Anal. Calcd for C$_{14}$H$_5$F$_{13}$S$_2$: C, 34.72; H, 1.04; F, 51.00. Found: C, 34.96; H, 0.99; F, 49.95; HRMS (EI, 70 eV): found m/z 483.9626, calcd for C$_{14}$H$_5$F$_{13}$S$_2$ (M$^+$) 483.9625.

Example 17c

5-Perfluorohexyl-5'-bromo-2,2'-dithiophene. With the exclusion of light, NBS (1.02 g, 5.73 mmol) was added to a solution of 5-perfluorohexyldihiophene (2.32 g, 4.79 mmol) in DMF (32 mL). After stirring overnight at room temperature, the reaction mixture was poured onto brine (120 mL) and the solution then extracted with ether (3×100 mL). The organic phase was next washed with water, dried over MgSO$_4$, filtrated, and the solvent evaporated to afford 2.60 g of crude product. Flash chromatography on silica gel (hexane) afforded the title compound as a light yellow solid (2.10 g, 3.73 mmol, 77.8% yield). Sublimation (50° C./10$^{-3}$ Torr) afforded a purer sample. M.p. 63–65° C.; $^1$H NMR (CDCl$_3$) δ 7.34 (1H, d,), 7.12 (1H, d, $^2$J=3.1), 7.03 (1H, d, $^2$J=3.3), 7.01 (1H, d); $^{19}$F NMR (CDCl$_3$) δ −81.07 (3F), −101.64 (2F), −121.83 (4F, broad), −123.11 (2F), −126.43 (2F).(fluorine NMR to be recorded). Anal. Calcd for C$_{14}$H$_4$BrF$_{13}$S$_2$: C, 29.86; H, 0.72; F, 43.86. Found: C,; H,; F,; HRMS (EI, 70 eV): found m/z 563.8721, calcd for C$_{14}$H$_4$BrF$_{13}$S$_2$ (M$^+$) 563.8709.

Example 17d 5-(tri-n-Butylstannyl)-5'-(1-perfluorohexyl)-2,2'-dithiophene. n-BuLi (1.6 M, 1.11 mL) was added dropwise to a solution of 5-bromo-5'-(1-perfluorohexyl)-2,2'-dithiophene (1.00 g, 1.77 mmol) in THF (15 mL) at −78° C. The reaction mixture was stirred at this temperature for 30 min, and then for 1 h at room temperature followed by the addition of tri-n-butyltin chloride (0.59 g, 1.80 mmol). After stirring for 3 h at room temperature, hexane (50 mL) was added to the mixture and the organic phase was washed with a solution of NH$_4$Cl (5%, 20 mL) and water (20 mL). The clear solution was dried over MgSO$_4$ and concentrated in vacuo to afford the product as a brown oil (1.32 g, 1.71 mmol, 96.6% yield). $^1$H NMR (CDCl$_3$) δ 7.36 (1H, d, $^2$J=3.3), 7.32 (1H, d, $^2$J=3.7), 7.15 (1H, d), 7.09 (1H, d), 1.54–1.60 (6H, m), 1.32–1.38 (6H, m), 1.13 (6H, t, $^2$J=8.1), 0.90 (9H, t, $^2$J=7.3); $^{19}$F NMR (CDCl$_3$) δ −81.28 (3F), −101.70 (2F), −121.79 (2F), −122.00 (2F), −123.13 (2F), −126.43 (2F). HRMS (EI, 70 eV): found m/z 774.0680, calcd for C$_{26}$H$_{44}$S$_2$Sn (M$^+$) 774.0682.

Example 17e 5,5'''-Diperfluorohexyl-2,2':5',2'':5'',2''':55''',2''''-quaterthiophe A mixture of 5-(tri-n-butylstannyl)-5'-(1-perfluorohexyl)-2,2'-dithiophene (1.31 g, 1.70 mmol), 5-perfluorohexyl-5'-bromo-2,2'-dithiophene (0.96 g, 1.70 mmol) and tetrakis(triphenylphosphine)palladium(0) (0.05 g, 0.04 mmol) in dry DMF (10 mL) was deareated twice with nitrogen. The reaction mixture was then heated at 95° C. for 5 h during which time a precipitate formed. After cooling, the bright yellow solid was collected and washed several times with methanol and Et$_2$O to afford the analytically pure product (1.30 g, 1.35 mmol, 79.4% yield). M.p. 213° C. Additional purification can be achieved by gradient sublimation. $^1$H NMR (C$_2$Cl$_4$D$_2$, ~60° C.) δ 8.28 (2H, d, $^2$J=3.8), 8.09–8.14 (4H, m), 7.08 (1H, d, $^2$J=4.0); $^{19}$F NMR (C$_2$Cl$_4$D$_2$, ~60° C.) δ −79.64 (3F), −99.88 (2F), −120.10 (4F), −121.41 (2F), −124.64 (2F). Anal. Calcd for C$_{28}$H$_8$F$_{26}$S$_4$: C, 34.81; H, 0.84; F, 51.14. Found: C, 34.66; H, 0.94; F, 51.06; MS (EI, 70 eV) 965.9 (M$^+$, 100%).

Example 17f

3-Perfluorohexyl-2,2'-dithiophene. A suspension of copper bronze (6.76 g, 106.32 mmol) in dry DMSO (60 mL) was heated at 125° C. for 15 min under nitrogen. Perfluorohexyl iodide (22.68 g, 50.86 mmol) was added dropwise in such a way as to keep the temperature below 135° C. After 40 min, a solution of 3-bromo-2.2'-dithiophene (5.00 g, 20.34 mmol) in the same solvent (14 mL) was added dropwise, and the reaction mixture was stirred at 125° C. for 6 h. The reaction was next quenched with cold water (200 mL) and diethyl ether was added (300 mL). After shaking, the mixture was filtered through Celite and the organic phase was collected. The aqueous layer was extracted once more with ether (300 mL) and the two organic phases were combined, washed with water, and dried over $MgSO_4$. After filtration, the solvent was evaporated to give a brown oil (~9 g) which was chromatographed on silica gel (hexane) to afford the product as a yellow oil (5.20 g, 10.74 mmol, 52.8% yield). $^1$H NMR ($CDCl_3$) δ 7.44 (1H, dd, $^2J=5.2$ $^3J=1.3$), 7.41 (1H, d, $^2J=5.5$), 7.20–7.24 (2H, m), 7.09 (1H, dd); $^{19}$F NMR ($CDCl_3$) δ −81.20 (3F), −102.95 (2F), −121.18 (2F), −122.01 (2F), −123.09 (2F), −126.43 (2F). Anal. Calcd for $C_{14}H_5F_{13}S_2$: C, 34.72; H, 1.04; F, 51.00. Found: C, 35.01; H, 1.04; F, 49.98; HRMS (EI, 70 eV): found m/z, calcd for $C_{14}H_5F_{13}S_2$ ($M^+$).

Example 17g 3-(1-Perfluorohexyl)-5'-bromo-2,2'-dithiophene. In the absence of light NBS (1.47 g, 8.26 mmol) was added portionwise to a solution of 3-(1-perfluorohexyl)-2,2'-dithiophene (4.00 g, 8.26 mmol) in DMF (70 mL) at −30° C. over the period of 6 h. The reaction mixture was left to slowly reach room temperature and, after stirring overnight, was poured onto water (100 mL). The aqueous phase was extracted with ether (3×100 mL) and the combined ethereal phases were washed with water and dried over $MgSO_4$. The solvent was evaporated leaving a brown oil (4.35 g), which was chromatographed on silica gel (hexane) to afford the title compound as a light yellow oil (3.67 g, 6.51 mmol, 78.8% yield). $^1$H NMR ($CDCl_3$) δ 7.42 (1H, d, $^2J=5.5$), 7.21 (1H, d), 6.40 (1H, d, $^2J=3.9$), 6.96 (1H, d). $^{19}$F NMR ($CDCl_3$) δ −81.18 (3F), −103.35 (2F), −121.26 (2F), −122.10 (2F), −123.19 (2F), −126.51 (2F). HRMS (EI, 70 eV): found m/z, calcd for $C_{14}H_4BrF_{13}S_2$ ($M^+$).

Example 17h 3,3''''-Diperfluorohexyl-2,2':5',2'':5'',2''':5''',2'''':5'''',2'''''-sexithiophene. of 5,5'-bis(tri-n-butylstannyl)-2,2'-dithiophene (2.00 g, 3.55 mmol), 5-perfluorohexyl-5'-bromo-2,2'-dithiophene (1.40 g, 1.88 mmol) and tetrakis(triphenylphosphine)palladium(0) (0.05 g, 0.04 mmol) in dry DMF (40 mL) was deareated twice with nitrogen. The reaction mixture was then heated at 90° C. overnight during which time a precipitate formed. After cooling, the bright orange solid was collected and washed several times with ether to afford the analytically pure product (1.80 g, 1.59 mmol, 89.6% yield). M.p. 217° C. Additional purification can be achieved by gradient sublimation. $^1$H NMR ($C_2Cl_4D_2$, 110° C.) δ 7.43 (2H, d, $^2J=5.6$), 7.24 (1H, d), 8.14–8.19 (8H, m); $^{19}$F NMR ($C_2Cl_4D_2$, 110° C.) δ −81.30 (6F), −102.22 (4F), −120.71 (2F), −121.51 (4F), −122.68 (4F), −125.94 (4F). Anal. Calcd for $C_{36}H_{12}F_{26}S_6$; C, 38.24; H, 1.07; F, 43.69. Found: C, 38.41; H, 1.07; F, 43.60.

Example 18a 5,5'-Bis[1-(4-bromo-2,3,5,6-tetrafluoroiphenyl)]-2,2'-dithiophene. A mixture of 5,5'-bis(tri-n-butylstannyl)-2,2'-dithiophene (4.62 g, 4.87 mmol), 1,4-dibromoperfluorobenzene (6.00 g, 19.48 mmol) and tetrakis(triphenylphosphine)palladium(0) (0.12 g, 0.10 mmol) in dry DMF (20 mL) was deareated twice with nitrogen. The reaction mixture was then heated at 85° C. for 20 h during which time a precipitate formed. After cooling, the orange solid was collected and washed several times with hexane and ether to afford the crude product which was purified by gradient sublimation (2.14 g, 3.42 mmol, 70.2% yield). M.p. 231° C. $^1$H NMR ($CDCl_3$) δ 7.60 (2H, d, $^2J=4.1$), 7.34 (2H, d); $^{19}$F NMR ($CDCl_3$) δ −133.58 (4F), −138.56 (4F). Anal. Calcd for $C_{20}H_4Br_2F_8S_2$: C, 38.72; H, 0.65; F, 24.51. Found: C, 38.75; H, 0.78; F, 24.29.

Example 18b 5,5'-Bis {1-[4-(thien-2-yl)-2,3,5 6-tetrafluorophenyl)]}-2,2'-dithiophene. A mixture of 2-(tri-n-butylstannyl)thiophene (1.35 g, 3.63 mmol), 5,5'-bis[1-(4-bromo-2,3,5,6-tetrafluorophenyl)]-2,2'-dithiophene (0.75 g, 1.20 mmol) and tetrakis(triphenylphosphine)palladium(0) (0.02 g, 0.02 mmol) in dry toluene (20 mL) was deareated twice with nitrogen. The reaction mixture was refluxed for 20 h during which time a precipitate formed. After cooling, the orange-gold solid was collected and washed several times with hexane and ether to afford the pure product after gradient sublimation (0.55 g, 0.88, 73.3% yield). M.p. 319° C. $^1$H NMR ($C_2Cl_4D_2$, 125° C.) δ 7.71 (1H, d, $^2J=3.8$), 7.66 (1H, d, $^2J=3.9$), 7.62 (1H, d, $^2J=4.6$), 7.40 (1H, d), 7.26 (1H, dd); $^{19}$F NMR ($C_2Cl_4D_2$, 125° C.) δ −140.91 (8F). Anal. Calcd for $C_{28}H_{10}F_8S_4$: C, 53.67; H, 1.61; F, 24.26. Found: C, 53.80; H, 1.71; F, 24.35.

Example 18c

2-Perfluorophenylthiophene. A mixture of 2-(tri-n-butylstannyl)thiophene (15.0 g, 40.50 mmol), bromoperfluorobenzene (16.00 g, 40.50 mmol), tetrakis(triphenylphosphine)palladium(0) (0.92 g, 0.80 mmol) and few crystals of 2,6-di-tert-butyl-4-methylphenolo in dry toluene (80 mL) was deaerated twice with nitrogen. The reaction mixture was refluxed 24 h and, after cooling, poured onto a solution of $NH_4F$ (5 g, 200 mL of water). After stirring for 30 min, hexane (300 mL) and acetone (150 mL) were added and the mixture was filtered over celite. The organic phase was separated, dried over $MgSO_4$, and the solvent was evaporated to afford a brown oil (18.36 g), which was chromatographed on silica gel (hexane) to give the pure product as a white solid (8.25 g, 32.97 mmol, 81.41% yield). M.p.=44° C. $^1$H NMR ($CDCl_3$) δ (1H, dd, $^2J=5.2$, $^3J=0.9$), (1H, dd, $^2J=3.5$), (2H, m). $^{19}$F NMR ($CDCl_3$) δ −(4F), −(4F). HRMS (EI, 70 eV): found m/z, calcd for $C_{10}H_3F_5S$ ($M^+$).

Example 18d

2-Perfluorophenyl-5-bromothiophene. In the absence of light NBS (2.45 g, 13.79 mmol) was added to a solution of 2-perfluorophenylthiophene (300 g, 11.99 mmol) in DMF (50 mL). After stirring overnight at room temperature, iced water (200 mL) was added and the precipitate was collected, washed with water, and dried under vacuum to afford the pure product as a white solid (3.70 g, 11.24 mmol, 93.7% yield). Mp=79° C. $^1$H NMR ($CDCl_3$) δ 7.30 (1H, d, $^2J=4.0$), 7.16 (1H, d). $^{19}$F NMR ($CDCl_3$) δ −140.04 (1F), −155.07 (2F), −161.65 (2F). HRMS (EI, 70 eV): found m/z, calcd for $C_{10}H_2BrF_5S$ ($M^+$).

Example 18e 5,5'''-Diperfluorophenyl-2,2':5',2'':5'',2''':5''',2''''-quaterthiophene. A mixture of 5,5'-bis(tri-n-butylstannyl)-2, 2'-dithiophene (2.26 g, 3.04 mmol), 2-perfluorophenyl-5-bromothiophene (2.00 g, 6.08 mmol) and tetrakis(triphenylphosphine)palladium(0) (0.07 g, 0.06 mmol) in dry DMF (40 mL) was deareated twice with nitrogen. The reaction mixture was refluxed overnight during which time a precipitate formed. After cooling, the orange solid was collected and washed several times with hexane, MeOH, and ether to afford the pure product as an orange solid (1.58 g, 2.38 mmol, 78.3% yield). Additional purification can be achieved by gradient sublimation. M.p. 246° C. $^1$H NMR ($C_2Cl_4D_2$, 125° C.) δ 7.50 (2H, d, $^2J$=3.5), 7.29 (2H, d), 7.23 (2H, d, $^2J$=3.8), 7.19 (1H, d); $^{19}$F NMR ($C_2Cl_4D_2$, 125° C.) δ –140.03 (2F), –156.40 (4F), –162.66 (4F). Anal. Calcd for $C_{28}H_8F_{10}S_4$: C, 50.75; H, 1.22; F, 28.67. Found: C, 50.85; H, 1.28; F, 28.95.

Example 19a 4,6-Di(thien-2-yl)pyrimidine. A mixture of tri-n-butylstannylthiophene (10.52 g, 28.19 mmol), 4,6-dichloropyrimidine (2.00 g, 13.42 mmol), tetrakis(triphenylphosphine)palladium(0) (0.345 g, 0.30 mmol) and few crystals of 2,6-di-tert-butyl-4-methylphenolo in dry toluene (20 mL) was deareated twice with nitrogen. The reaction mixture was refluxed for 6 hours and, after cooling, a white precipitate was formed in the reaction flask. The solid was collected and the organic phase was diluted with ether (100 mL), poured onto a solution of $NH_4F$ (3 g, 100 ml) and separated. After drying over MgSO4, the solvent was evaporated affording a solid material. The two solid phase were combined and crystallized from toluene to give the pure product as a white crystals (2.36 g, 9.66 mmol, 72.0% yield). mp 146° C.; $^1$H NMR (CDCl$_3$) δ 9.07 (1H, d, $^2J$=1.4), 7.86 (1H, d, $^2J$=3.7), 7.83 (1H, d), 7.57 (1H, d, $^2J$=5.1), 7.20 (1H, dd).

Example 19b 5,5'-Bis-(6-chloropyrimid-4-yl)-2,2'-dithiophene. A mixture of 5,5'-bis(tri-n-butylstannyl)-2,2'-dithiophene (7.58 g, 10.18 mmol), 4,6-dichloropyrimidine (6.00 g, 40.27 mmol) and tetrakis(triphenylphosphine)palladium(0) (0.26 g, 0.22 mmol) in dry toluene (70 mL) was deareated twice with nitrogen. The reaction mixture was refluxed for 6 hours and, after cooling, the precipitate was collected. The solid residue was washed several times with hexane and than with methanol to afford the practically pure compound as a yellow powder (2.80 g, 7.16 mmol, 70.3% yield). mp 261° C. (sublimation); $^1$H NMR (CDCl$_3$) δ 8.91 (2H, d, $^2J$=1.3), 7.73 (2H, d, $^2J$=4.0), 7.60 (2H, d), 7.37 (2H, d,). ms 390.9(100%) 392.9 (75%). Anal. Calcd for $C_{16}H_8Cl_2N_4S_2$: C, 49.11; H, 2.06; N, 14.32. Found: C, 49.21; H, 2.19; N, 14.16.

Example 19c 5,5'-Bis[6-(thien-2-yl)pyrimid-4-yl)]-2,2'-dithiophene. A mixture of 5,5'-bis(6-chloropyrimid-4-yl)-2,2'-dithiophene (1.40 g, 3.58 mmol), tri-n-butylstannylthiophene (3.00 g, 8.04 mmol), tetrakis(triphenylphosphine)palladium(0) (0.20 g, 0.17 mmol) and few crystals of 2,6-di-tert-butyl-4-methylphenolo in dry toluene (120 mL) was deareated twice with nitrogen. The reaction mixture was refluxed for 10 hours and, after cooling, the precipitate was collected (2.00 g). The solid residue was washed several times with hexane and than crystallized from pyridine (170 mL) to afford the pure compound as an orange solid (0.88 g, 1.81 mmol, 50.5% yield). Extremely pure samples can be obtained after gradient sublimation. mp=306° C.; $^1$H NMR (CDCl$_3$) δ 9.09 (2H, d, $^2J$=1.2), 7.94 (2H, d, $^2J$=3.7), 7.85 (2H, d, $^2J$=4.0), 7.83 (2H, d), 7.61 (2H, d, $^2J$=4.9), 7.41 (2H, d), 7.24 (2H, dd). ms 487.0 (100%). Anal. Calcd for $C_{24}H_{14}N_4S_4$: C, 59.23; H, 2.91; N, 11.52. Found: C, 59.17; H, 2.97; N, 11.37.

Example 19d 5,5'-Bis[6-(5-hexylthien-2-yl)pyrimid-4-yl)]-2,2'-dithiophene. A mixture of 5,5'-bis(6-chloropyrimid-4-yl)-2,2'-dithiophene (1.05 g, 2.68 mmol)), 2-(tri-n-butylstannyl)-5-hexylthiophene (2.60 g, 5.68 mmol), tetrakis(triphenylphosphine)palladium(0) (0.15 g, 0.13 mmol) and few. crystals of 2,6-di-tert-butyl-4-methylphenolo in dry toluene (90 mL) was deareated twice with nitrogen. The reaction mixture was refluxed for 12 hours and, after cooling, the precipitate was collected by centrifugation (1.66 g). The solid residue was washed once with hexane and than dissolved in hot chloroform (150 mL). The warm solution was filtered and the solvent evaporated to give the pure product as a brown solid (1.21 g, 1.85 mmol, 71.1% yield). An analytical sample was crystallized from toluene and sent to the elemental analysis. mp=230° C.; $^1$H NMR (CDCl$_3$) δ ???? (2H, d, $^2J$=1.2), ???? (2H, d, $^2J$=3.7), (2H, d, $^2J$=4.0), (2H, d), (2H, d, $^2J$=4.9), (2H, d), (2H, dd). Anal. Calcd for $C_{36}H_{38}N_4S_4$: C, 66.01; H, 5.86; N, 8.56. Found: C, 65.88; H, 5.57; N, 8.57.

Example 19e 3-(Thien-2-yl)-6-chloropyridazine. A mixture of tri-n-butylstannylthiophene (6.26 g, 16.78 mmol), 3,6-dichloropyridazine (5.00 g, 33.56 mmol), tetrakis(triphenylphosphine)palladium(0) (0.20 g, 0.17 mmol) and few crystals of 1,2-ditert-butyl of 2,6-di-tert-butyl-4-methylphenolo in dry DMF (50 mL) was deareated twice with nitrogen. The reaction mixture was heated at 80° C. for 6 hours and, after cooling, poured onto water (100 mL). A white precipitate was collected, washed several times with water and dried under vacuum. This solid was taken up with ether (25 mL) and filtered to afford 3.01 g of almost pure product. Finally, this solid was crystallized from MeOH—$H_2O$ to give the pure target compound as white crystals (1.56 g, 7.90 mmol, 47.3% yield). Mp 155° C.; $^1$H NMR (CDCl$_3$) δ 7.75 (1H, d, $^2J$=11.0), 7.68 (1H, d, $^2J$=3.6), 7.54 (1H, d, $^2J$=5.0), 7.51 (1H, d), 7.18 (1H, dd).

Example 19f 5,5'-Bis[6-(thien-2-yl)pyridazin-3-yl)]-2,2'-dithiophene. A mixture of 3-(thien-2-yl)-6-chloropyridazine (1.50 g, 7.63 mmol), 5,5'-bis(tri-n-butylstannyl)-2,2'-dithiophene (2.84 g, 3.81 mmol), and tetrakis(triphenylphosphine)palladium(0) (0.09 g, 0.08 mmol) in dry DMF (30 mL) was deareated twice with nitrogen. The reaction mixture was heated at 70° C. overnight. After cooling, the precipitate was collected, washed several times with hexane, MeOH, and ether. After drying the pure product was obtained as a light orange solid (1.60 g, 3.29, 86.3% yield). mp>350° C. Anal. Calcd for $C_{24}H_{14}N_4S_4$: C, 59.23; H, 2.91; N, 11.52. Found: C, 58.85; H, 3.11; N, 11.57.C.

Example 20

The data of the following examples illustrate the impact of both perfluoroalkyl and perfluorophenyl/azine substitution on the chemical, thermal, optical and electronic properties of the π-conjugated core by thermal (DSC, TGA), molecular spectroscopy (UV-Vis, PL), and electrochemical (CV, DPP), techniques. Reference systems are the unsubstituted (6T) and αω-dihexyl substituted (DH-6T)

sexithiophenes of the prior art. Morphological and crystal structure data are also provided.

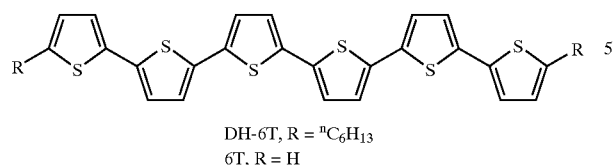

DH-6T, R = $^nC_6H_{13}$
6T, R = H

Example 20a

Figure 9:
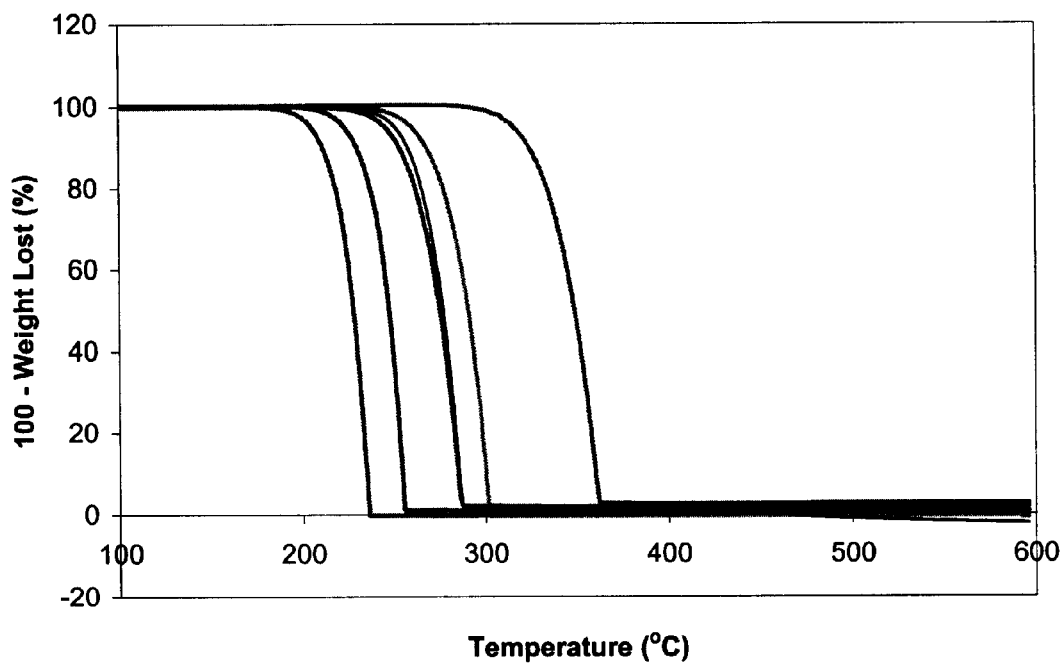
FIG. 9 provides a reduced pressure (0.01 torr) TGA weight loss comparison of the volatility characteristics of compositions 1e, 1h, 2a, 2b, 3a, 3c, with reference to compositions 6T and DH-6T.
Figure 9:
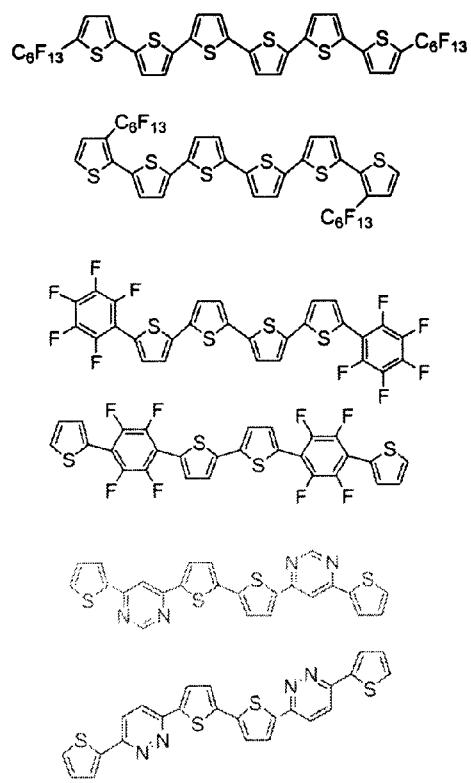

With reference to FIG. 2 (and Example 2), the αω-fluorocarbon chains have a dramatic effect on the volatility of most of systems 1–3 (FIG. 9). The monotonic % weight retention vs. T demonstrates smooth, clean, quantitative sublimation well below the melting point with negligible residue. In contrast, DH-6T (FIG. 2) exhibits significant volatility only above the melting point, with the TGA data revealing inflections at ≈298 and ≈306° C., suggesting decomposition processes. In addition, a significant decomposition-related residue (≈6%) is observed at 320° C.

Example 20b

Figure 10:
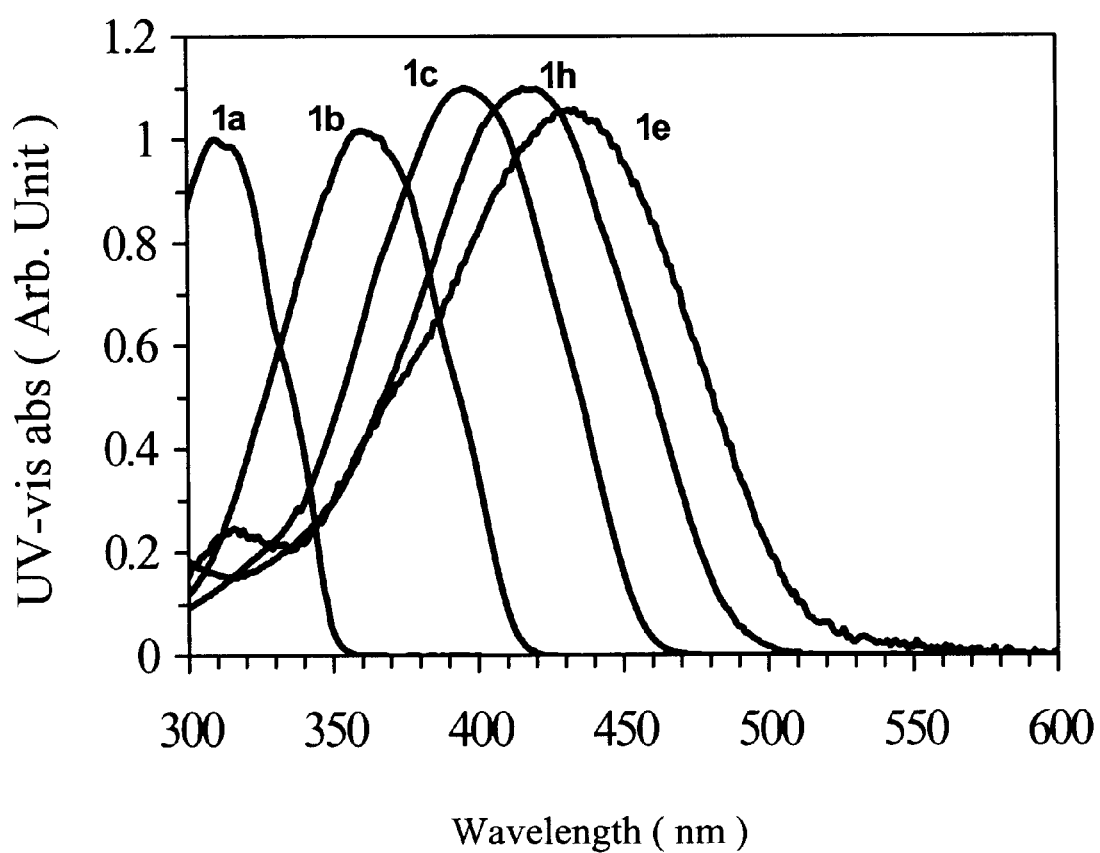
FIG. 10 shows UV-Vis absorption spectra of 1a–c, 1e, 1h in toluene.
Figure 11:
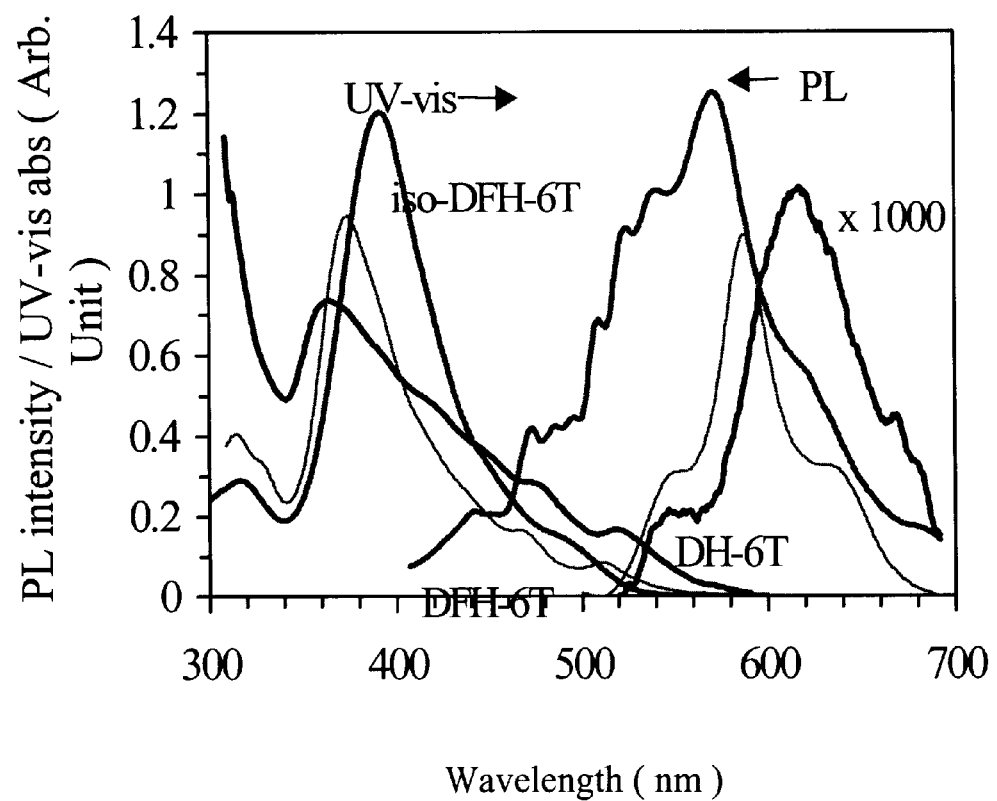
FIG. 11 shows, comparatively, thin film (1.8 $\mu$m) UV-Vis/PL spectra of A) DH-6T, 1e, and 1h B) 2a, b.
Figure 11:
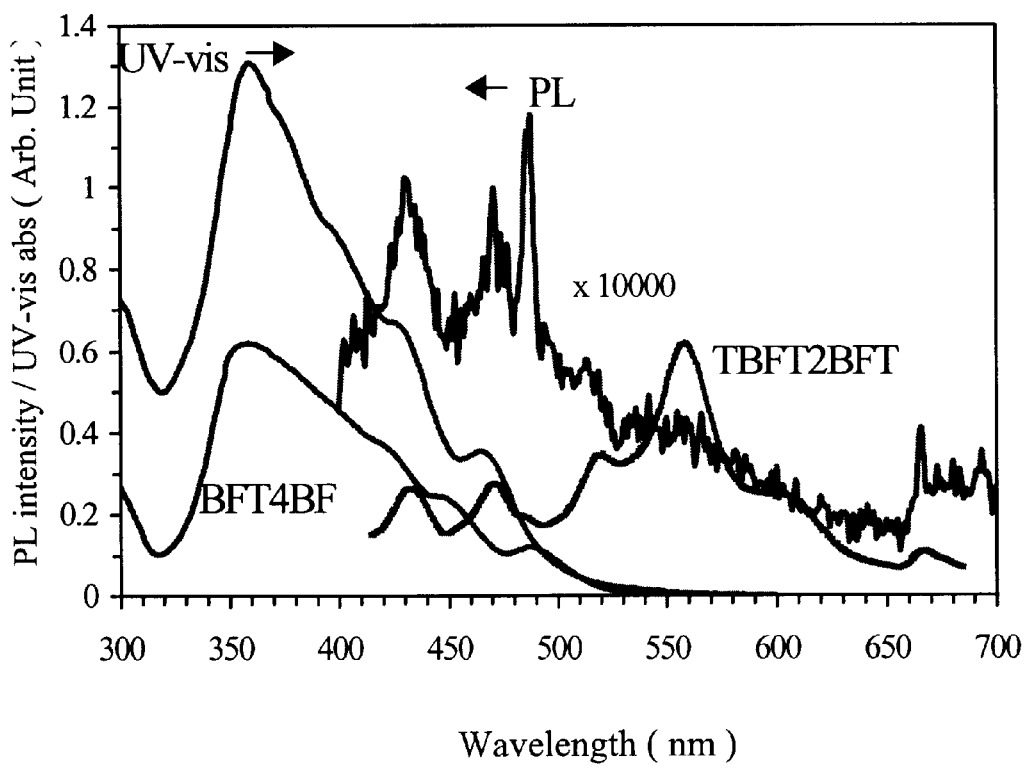
Figure 12:
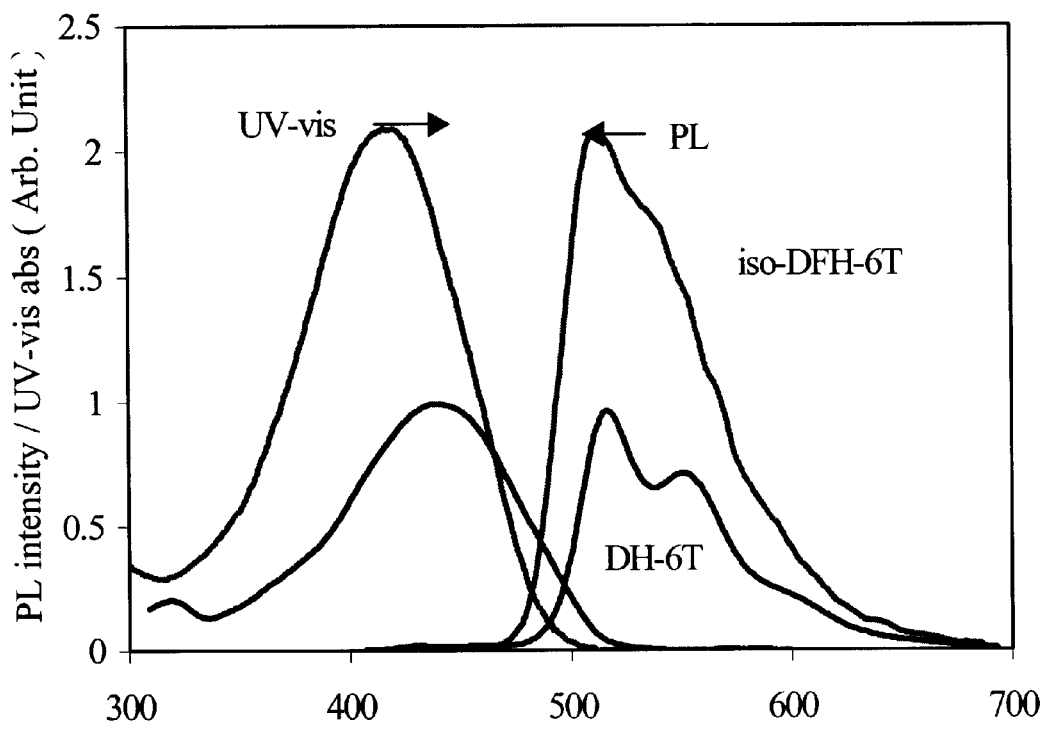
FIG. 12 shows, comparatively, toluene solution (saturated) UV-Vis/PL spectra of A) DH-6T and 1h B) 2a, b.
Figure 12:
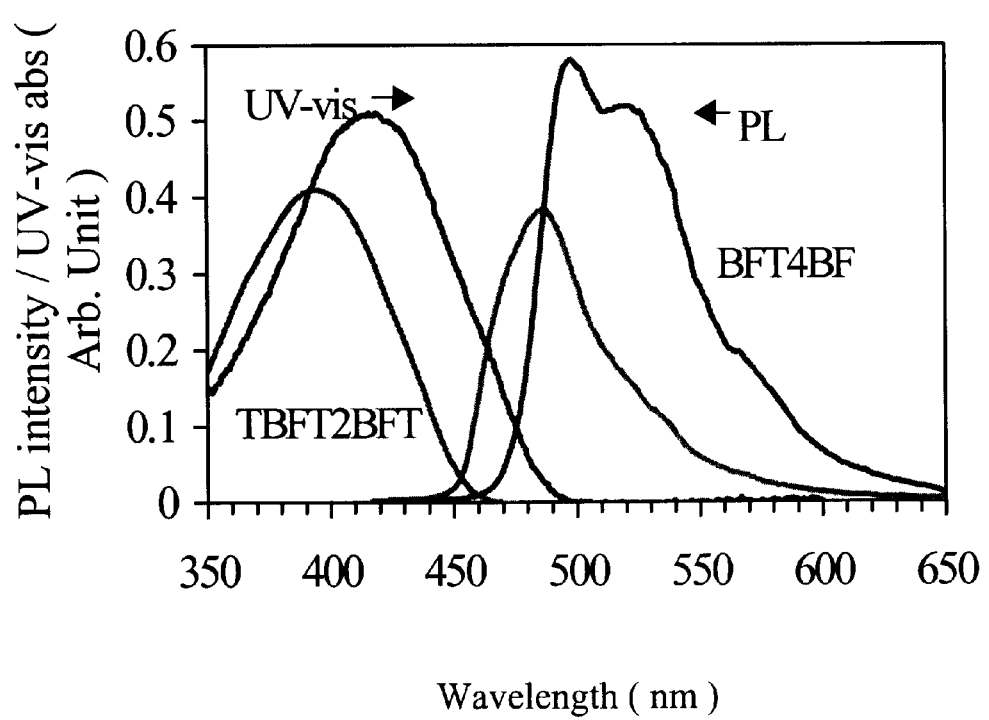

Absorption and fluorescence emission spectra were recorded to monitor the effect of substitution on the HOMO-LUMO energy gap. By varying the number of thiophene units, it is possible to modulate optical absorption from 300 to 500 nm (FIG. 10). On the other hand, fluorophenyl-azine insertion into the 6T core allows for a very fine tune in the range of 450–500 nm (Table 1). Film PL intensities change of many orders of magnitude with chemical structure. DFH-6T and iso-DFH-6T were found much more efficient that the corresponding unsubstituted and dialkyl substituted systems. 2a is substantially more efficient than 2b in spite of the similar solution absorption/emission and film absorption patterns. Comparative spectra are also shown in FIGS. 11–12.

TABLE 1

Absorption ($\lambda_{max}$, nm) Data in Toluene Solution and as Thin Film (ca. 1.8 μm).

| | $\lambda_{max}$ | |
|---|---|---|
| Compound | Solution | Film |
| DFH-2T | 348 | |
| DFH-3T | 411 | |

TABLE 1-continued

Absorption ($\lambda_{max}$, nm) Data in Toluene Solution and as Thin Film (ca. 1.8 μm).

| | $\lambda_{max}$ | |
|---|---|---|
| Compound | Solution | Film |
| DFH-4T | 456 | 429 |
| isoDFH-6T | 482 | 461 |
| DFH-6T | 492 | 526 |
| DH-6T | 497 | 535 |
| BFT4BF | 475 | 456 |
| TBFT2BFT | 452 | 419 |
| BrBFT2BFBr | 428 | |
| TPMT2PMT | 451 | |
| TPDT2PDT | 462 | |

TABLE 2

HOMO-LUMO Energy Gap ($E_g$, eV) from Optical Data.

| | $E_g$ | |
|---|---|---|
| Compound | Solution | Film |
| DFH-2T | 3.57 | |
| DFH-3T | 3.02 | |
| DFH-4T | 2.72 | 2.89 |
| isoDFH-6T | 2.58 | 2.69 |
| DFH-6T | 2.52 | 2.36 |
| DH-6T | 2.50 | 2.32 |
| BFT4BF | 2.61 | 2.72 |
| TBFT2BFT | 2.75 | 2.96 |
| BrBFT2BFBr | 2.9 | |
| TPMT2PMT | 2.75 | |
| TPDT2PDT | 2.69 | |

Example 20c

Figure 13:
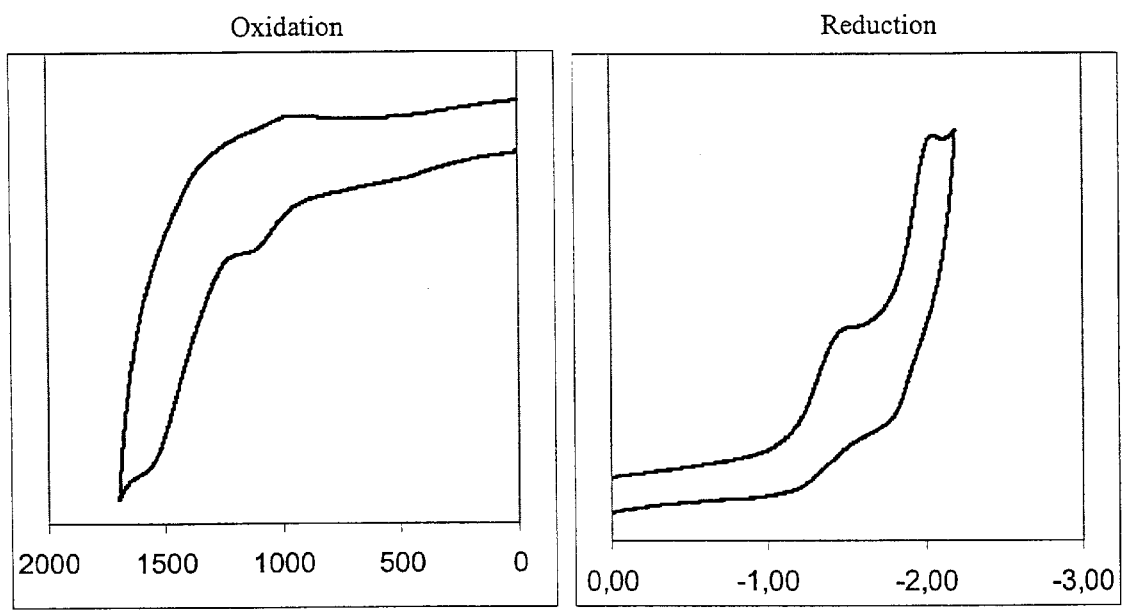
FIG. 13 shows cyclic voltammograms illustrating the oxidation and reduction peaks of 2a–b.
Figure 13:
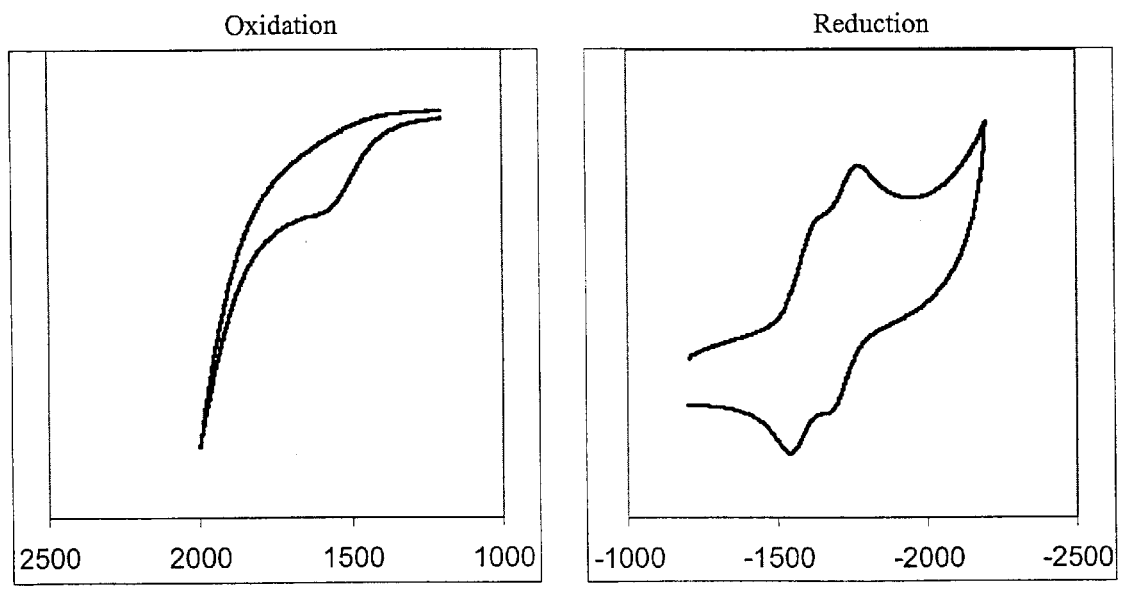
Figure 14:
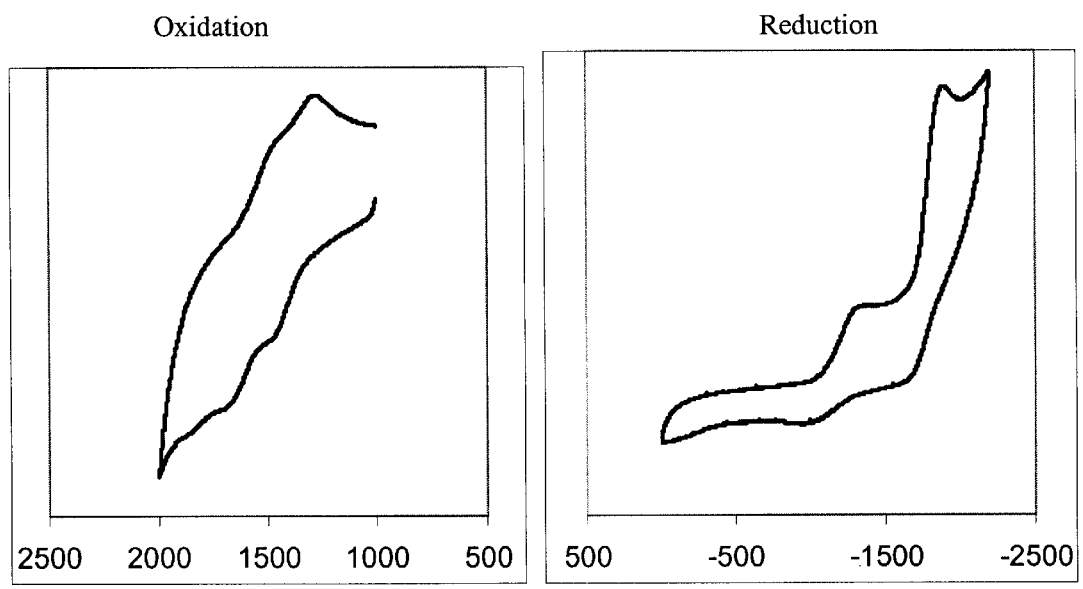
FIG. 14 shows cyclic voltammograms illustrating the oxidation and reduction peaks of 1h and 3c.
Figure 14:
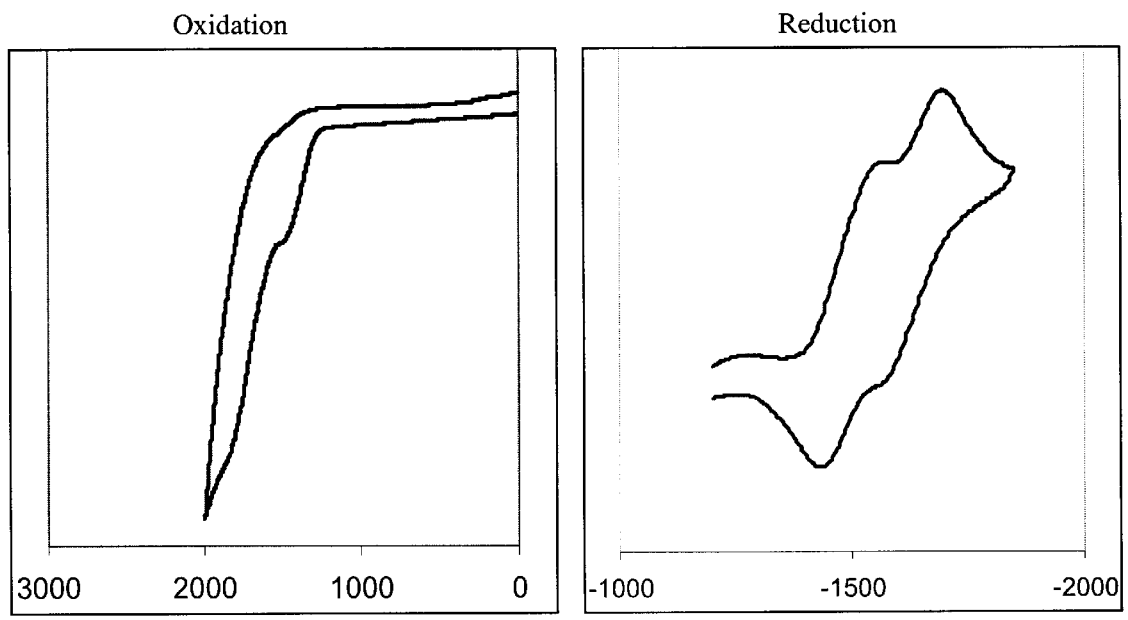
Figure 15:
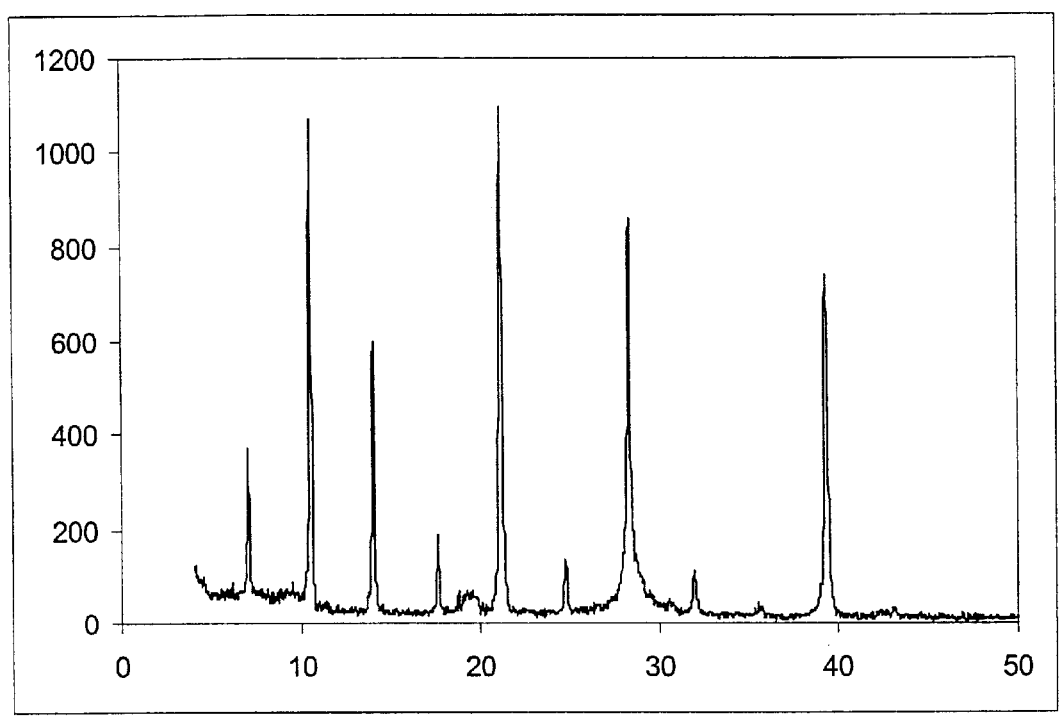
FIG. 15 provides an X-ray diffractogram of approximately 2 $\mu$m-thick vacuum-evaporated film of 2a on silicon substrate grown at 25° C. substrate temperature.

The effects of fluoroalkyl, fluorophenyl, and azine substitution-insertion were also investigated by cyclic voltammetry (one-compartment cell with Pt electrode, bare Ag reference, Pt counter electrodes). Results are collected on Table 3. Voltammograms of most of the investigated systems in THF/0.10M TBABF$_4$ exhibit two chemically oxidative and reductive peeks (FIGS. 13 and 14). Note that the first and second anodic peaks of DFH-6T vs. DH-6T exhibit a uniform anodic shift (≈+0.27 V), indicating that introduction of perfluoroalkyl chains on the 6T core substantially increases the ionization potential. The similar HOMO-LUMO gaps of DFH-6T and DH-6T argue that the LUMO of DFH-6T is also ca. 0.27 V below that of DH-6T, which is confirmed by electrochemical studies on thin films.

TABLE 3

Anodic ($E_a$), Cathodic($E_c$), and Standard (E°) Potentials of Compounds 1a–c, 1h, 2a–b, 3a, and, 3c in THF.

| | | Oxidation Potentials | | | | | | Reduction Potentials | | | | | |
|---|---|---|---|---|---|---|---|---|---|---|---|---|---|
| Compound | | standard | | anodic | | cathodic | | standard | | anodic | | cathodic | |
| anodic | cathodic | $E_{a1}$ | $E_{a2}$ | $E_{c1}$ | $E_{c2}$ | $E°_1$ | $E°_1$ | $E_{a1}$ | $E_{a2}$ | $E_{c1}$ | $E_{c2}$ | $E°_1$ | $E°_2$ |
| DFH-2T | 1.49 | | | | | | | −1.45 | | | | | |
| DFH-3T | 1.39 | | | | | | | −1.48 | | | | | |
| DFH-4T | 1.31 | | | | | | | −0.95 | | −1.75 | −0.76 | −1.40 | −0.85 | −1.57 |
| isoDFH-6T | 1.01 | 1.23 | 0.88 | 1.06 | 0.94 | 1.14 | | −1.47 | 1.97 | 1.06 | −1.74 | −1.26 | −1.86 |
| BFT4BF | 1.07 | 1.56 | 0.89 | 1.44 | 0.98 | 1.50 | | −1.56 | −2.14 | −1.38 | −1.96 | −1.47 | |

TABLE 3-continued

Anodic ($E_a$), Cathodic($E_c$), and Standard ($E°$) Potentials of Compounds 1a–c, 1h, 2a–b, 3a, and, 3c in THF.

| Compound | Oxidation Potentials | | | | | | Reduction Potentials | | | | | |
|---|---|---|---|---|---|---|---|---|---|---|---|---|
| | standard | | anodic | | cathodic | | standard | | anodic | | cathodic | |
| anodic | cathodic | $E_{a1}$ | $E_{a2}$ | $E_{c1}$ | $E_{c2}$ | $E°_1$ | $E°_1$ | $E_{a1}$ | $E_{a2}$ | $E_{c1}$ | $E_{c2}$ | $E°_1$ | $E°_2$ |
| TBFT2BFT | 1.43 | | | | | | −1.80 | −1.94 | −1.70 | −1.83 | −1.75 | −1.88 |
| TPMT2PMT | 1.42 | 1.69 | 1.16 | 1.41 | 1.29 | 1.55 | −1.74 | −1.87 | −1.60 | −1.75 | −1.67 |
| TPDT2PDT | 1.14 | 1.44 | | | | | −1.57 | −2.01 | −1.35 | −1.80 | −1.79 | −1.90 |

Example 20d

Figure 6:
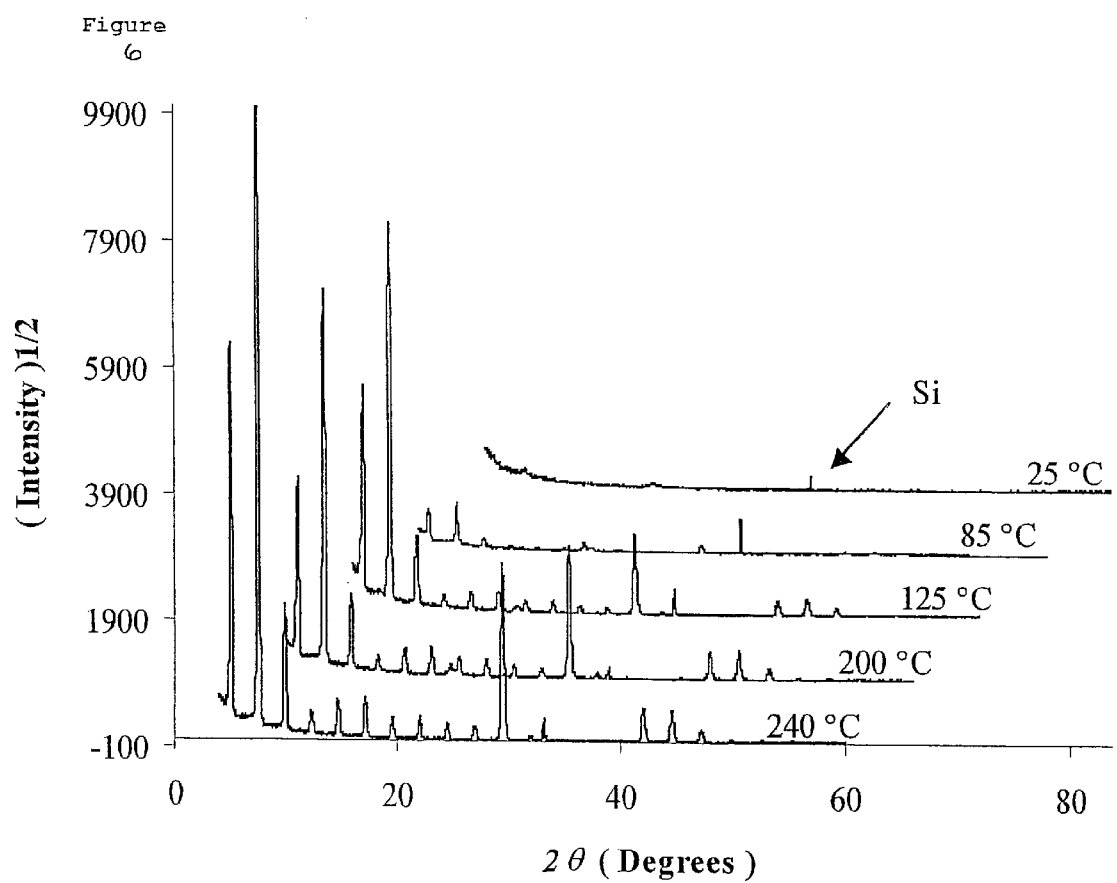
FIG. 6 provides X-ray θ–2θ diffractograms of ~2 μm thick vacuum-evaporated DFH-6T films grown on Si substrates at various substrate temperatures. Note that the 240° C. spectrum corresponds to a film grown at 200° C. and annealed at 240° C. for 30 min.

A morphological study on evaporated DFH-6T thin films was provided above, Example 6 and FIG. 6. In comparison thereto, general amorphous 1c, 1h, 2a, 2b, 3a, 3c films can be prepared by rapid evaporation on cold substrates (glass, quartz, silicon). Lower evaporation rates and/or higher substrate temperatures produce much higher ordered microstructures and larger crystalline domains (from SEM data). In addition, thanks to the great volatility of these systems annealing of amorphous films for short period of times dramatically improves microstructure order.

Example 20e

Figure 16:
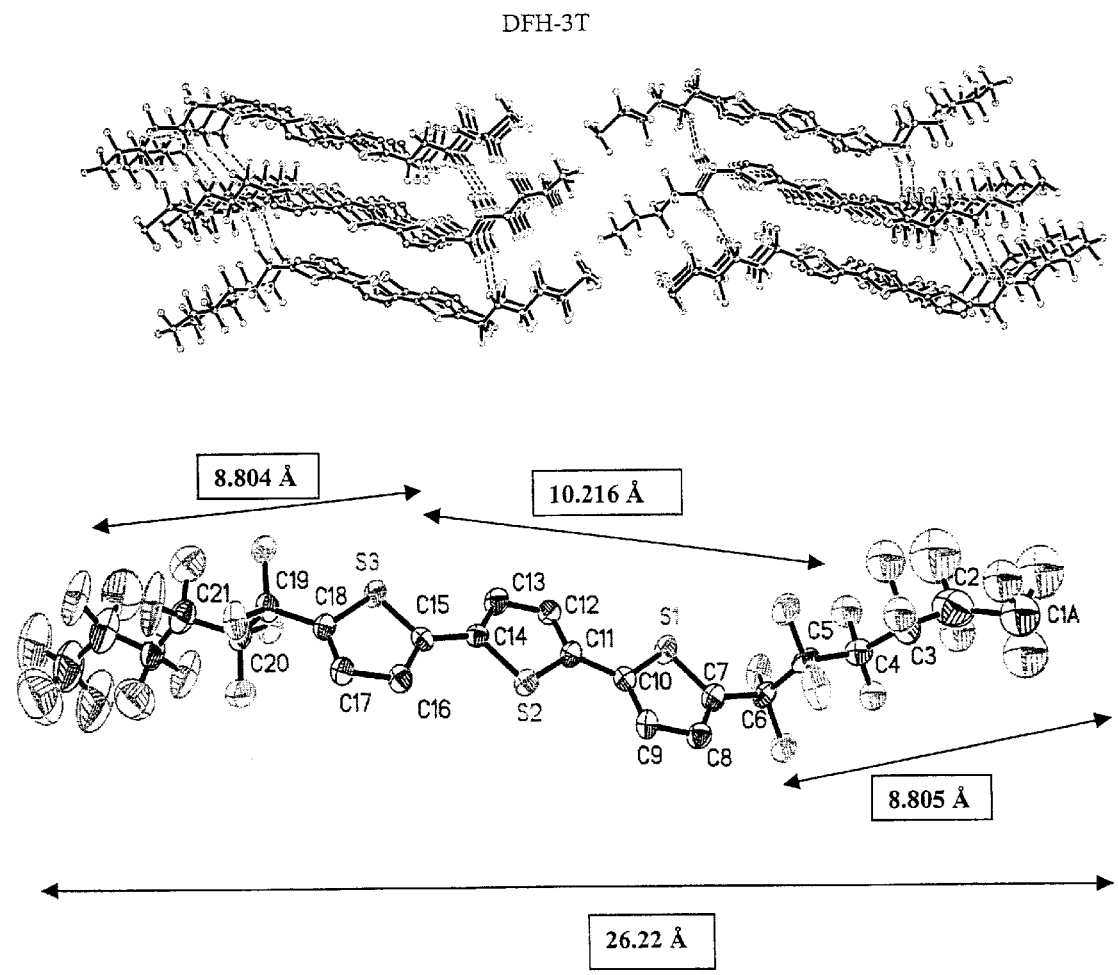
FIGS. 16 and 17 provide molecular stacking diagrams illustrating material structure and the resulting electrical properties in accordance with those and various other compositions of this invention.
Figure 17:
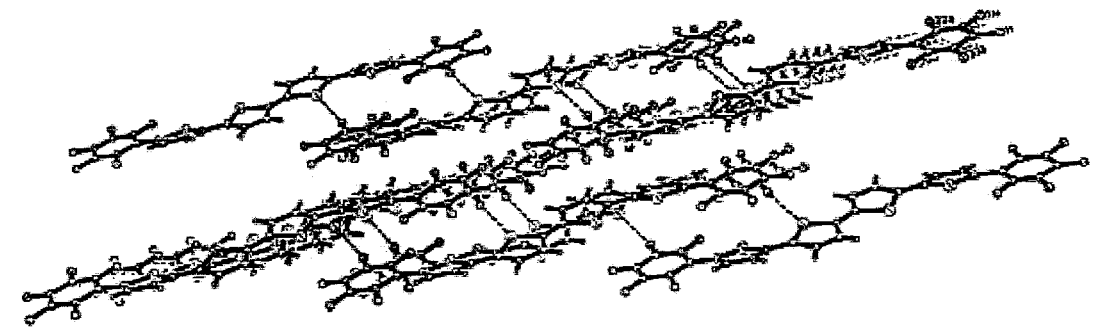
Figure 17:
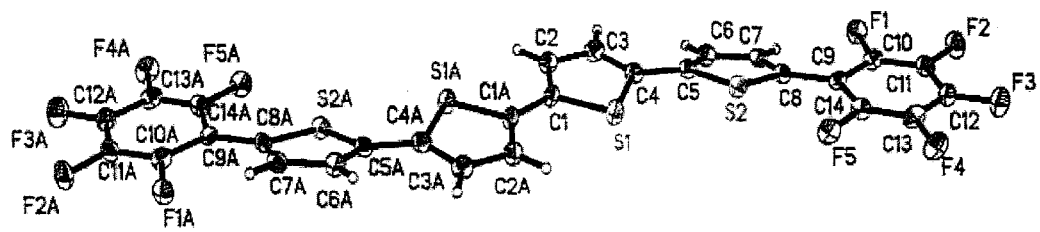

Molecular packing diagrams of DFH-3T and 2a are shown in FIGS. 16 and 17, respectively. The crystal structure clearly shows the close π-π stacking intermolecular arrangement in these systems, and as can be observed and/or utilized in various other embodiments of this invention.

The preceding examples and data confirm that the n-type thiophene-modified systems of this invention are more chemically and thermally stable than the corresponding p-type π-isoelectronic olio- and polythiophenes and can be transported quantitatively into the gas phase without decomposition. In particular, fluoro-azine substitution-insertion allows for an effective modulation of optical absorption-emission maximum, optical gap, and photoluminescent efficiencies (quantum yields) both in solution and as thin-deposited films. By combining the electrochemical and optical data, absolute orbital energies can be estimated. HOMO(LUMO) energies can be determined from the first oxidation(reduction) potentials. Modification of an all-thiophene framework by introduction of powerful electron-withdrawing groups or electron-poor heterocycles decreases MO energy levels, allowing for an easier electron injection. Depending on chemical nature of the system, deposition method (evaporation, spin-coating, casing), substrate temperature and pretreatment, either highly ordered or amorphous solids can be produced.

While the principles of this invention have been described in connection with specific embodiments, it should be understood clearly that the summary and descriptions herein, along with the chosen tables, graphs and data provided, are made only by way of example and are not intended to limit the scope of this invention in any manner. For example, a variety of the thiophene materials, of the type described herein, can be utilized as thin films incorporated into a wide range of electronic devices. Such devices and any related circuitry can be fabricated using complementary (n-type and p-type) thiophene materials. The chemical and corresponding physical properties of such compositions/materials such as n-type conductivity, electron affinity and electron mobility can be modified, as described herein, by choice of thiophene structure, fluoroalkyl substitution and/or heterocycle insertion, such modifications as may be desired for a particular end use application. Likewise, the substitution and/or insertion methods disclosed herein can also be applied to various non-thiophene systems, to alter electronic properties and/or provide n-type conductivity. Other advantages and features of this invention will become apparent from the foregoing and any claims made thereto, with the scope thereof determined by the reasonable equivalents, as would be understood by those skilled in the art.

What is claimed:

1. An n-type polythiophene composition having the structural formula

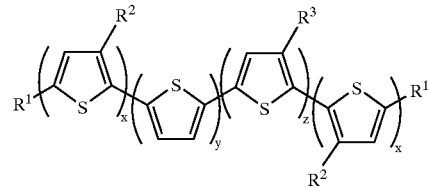

wherein $R_1$, $R_2$ and $R_3$ are selected from the substituent group consisting of fluoroalkyl moieties, $C_nH_{2n+1}$ and where n is about 1–12, H, F and $(CH_2)_aX$ and where a is about 1–12 and X is selected from the group consisting of amino, hydroxy and carboxylic acid functionalities; and x, y and z are integers selected from the group of integers consisting of 1 and integers greater than 1.

2. The n-type polythiophene composition of claim 1 wherein said fluoroalkyl moiety is selected from the group consisting of linear fluoroalkyl substituents, branched fluoroalkyl substituents and cyclic fluoroalkyl substituents.

3. The n-type polythiophene composition of claim 2 wherein said fluoroalkyl moiety has a compositional formula $C_nF_{2n+1}$, where n is about 1–8.

4. The n-type polythiophene composition of claim 1 wherein x is 1 to about 4; y is 1 to about 8, and z is 1 to about 12.

5. The n-type polythiophene composition of claim 4 wherein said fluoroalkyl moiety has the compositional formula $C_nF_{2n+1}$, where n is about 1–8.

6. An n-type polythiophene composition having the structural formula

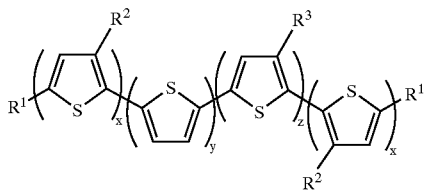

wherein $R_1$, $R_2$ and $R_3$ are selected from the substituent group consisting of fluoroalkyl moieties, $C_nH_{2n+1}$ and where n is about 1–12, H, F and $(CH_2)_aX$ and where a is about 1–12 and X is selected from the group consisting of amino, hydroxy and carboxylic acid functionalities; x and z are integers selected from the group of integers consisting of 1 and integers greater than 1; and y is an integer selected from the group of integers consisting of 0 and integers greater than 0, said composition wherein $R_2$ and $R_3$ are not the same fluoroalkyl moieties.

7. The n-type polythiophene composition of claim 6 wherein said fluoroalkyl moiety is selected from the group consisting of linear fluoroalkyl substituents, branched fluoroalkyl substituents and cyclic fluoroalkyl substituents.

8. The n-type polyhiophene composition of claim 7 wherein said fluoroalkyl moiety has a compositional formula $C_nF_{2n+1}$, where n is about 1–8.

9. The n-type polythiophene composition of claim 6 wherein x is 1 to about 4; y is 1 to about 8, and z is 1 to about 12.

10. The n-type polythiophene composition of claim 9 wherein said fluoroalkyl moiety has the compositional formula $C_nF_{2n+1}$, where n is about 1–8.

* * * * *

UNITED STATES PATENT AND TRADEMARK OFFICE
CERTIFICATE OF CORRECTION

PATENT NO.    : 6,585,914 B2
DATED         : July 1, 2003
INVENTOR(S)   : Tobin J. Marks and Antonio Facchetti It is certified that error appears in the above-identified patent and that said Letters Patent is hereby corrected as shown below:

Column 2,
Lines 2, 3, 4, 8 and 40, "Gamier" should be -- Garnier -- (5 instances);
Line 25, "Shon" should be -- Shön --;

Column 4,
Line 15, "δ" should be -- α --;

Column 20,
Line 40, "$E_{e,fra}$" should be -- $E_{1/2}$ --;

Column 22,
Line 16, "$cm^2NVs$" should be -- $cm^2/Vs$ --;

Column 26,
Line 51, "quaterthiophe" should be -- quaterthiophene --;

Column 27,
Line 48, "of 5,5'" should be -- A mixture of 5.5' --;
Line 66, "-tetrafluoroiphenyl" should be -- tetrafluorophenyl --;

Column 28,
Line 35, "16.00" should be -- 10.00 --;

Column 36,
Line 7, "polyhiophene" should be -- polythiophene --.

Signed and Sealed this

Twentieth Day of January, 2004

JON W. DUDAS
*Acting Director of the United States Patent and Trademark Office*